(12) United States Patent
Lin

(10) Patent No.: US 7,999,384 B2
(45) Date of Patent: *Aug. 16, 2011

(54) TOP LAYERS OF METAL FOR HIGH PERFORMANCE IC'S

(75) Inventor: Mou-Shiung Lin, Hsin-Chu (TW)

(73) Assignee: Megica Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 11/829,109

(22) Filed: Jul. 27, 2007

(65) Prior Publication Data

US 2007/0262456 A1 Nov. 15, 2007

Related U.S. Application Data

(60) Continuation of application No. 11/230,102, filed on Sep. 19, 2005, now Pat. No. 7,368,376, which is a continuation of application No. 11/121,477, filed on May 4, 2005, now Pat. No. 7,294,870, which is a continuation of application No. 10/389,543, filed on Mar. 14, 2003, now Pat. No. 6,965,165, which is a division of application No. 09/972,639, filed on Oct. 9, 2001, now Pat. No. 6,657,310, which is a division of application No. 09/251,183, filed on Feb. 17, 1999, now Pat. No. 6,383,916, which is a continuation-in-part of application No. 09/216,791, filed on Dec. 21, 1998, now abandoned.

(51) Int. Cl.
| | |
|---|---|
| *H01L 23/48* | (2006.01) |
| *H01L 23/52* | (2006.01) |
| *H01L 29/40* | (2006.01) |

(52) U.S. Cl. ................. 257/758; 257/E23.163

(58) Field of Classification Search .................. 257/758, 257/E23.163

See application file for complete search history.

(56) References Cited

U.S. PATENT DOCUMENTS

| | | | |
|---|---|---|---|
| 3,124,198 | A | 3/1964 | Solum et al. |
| 5,055,907 | A | 3/1964 | Dhaka et al. |
| 3,573,570 | A | 4/1971 | Fuller et al. |
| 3,823,349 | A | 7/1974 | Dhaka et al. |
| 4,021,838 | A | 5/1977 | Warwick |
| 4,024,041 | A | 5/1977 | Hanazono et al. |
| 4,028,780 | A | 6/1977 | Vernon |

(Continued)

FOREIGN PATENT DOCUMENTS

EP 1006572 6/2000

(Continued)

OTHER PUBLICATIONS

Stanley Wolf, Silicon Processing for the VLSI Era vol. 2: Process Integration, Lattice Press, Sunset Beach, CA, pp. 214-285,Copyright 1990.

(Continued)

*Primary Examiner* — Kiesha Bryant
*Assistant Examiner* — Igwe U Anya
(74) *Attorney, Agent, or Firm* — McDermott Will & Emery, LLP

(57) ABSTRACT

A method of closely interconnecting integrated circuits contained within a semiconductor wafer to electrical circuits surrounding the semiconductor wafer. Electrical interconnects are held to a minimum in length by making efficient use of polyimide or polymer as an inter-metal dielectric thus enabling the integration of very small integrated circuits within a larger circuit environment at a minimum cost in electrical circuit performance.

56 Claims, 9 Drawing Sheets

U.S. PATENT DOCUMENTS

| | | | |
|---|---|---|---|
| 4,060,828 A | 11/1977 | Satonaka | |
| 4,109,275 A | 8/1978 | Sarkary | |
| 4,152,195 A | 5/1979 | Bahrle et al. | |
| 4,188,636 A | 2/1980 | Sato et al. | |
| 4,189,909 A | 2/1980 | Marum | |
| 4,208,780 A | 6/1980 | Richman | |
| 4,242,336 A | 12/1980 | Hasegawa et al. | |
| 4,303,423 A | 12/1981 | Camplin et al. | |
| 4,380,115 A | 4/1983 | Pomante | |
| 4,423,547 A | 1/1984 | Farrar et al. | |
| 4,576,900 A | 3/1986 | Chiang | |
| 4,617,193 A | 10/1986 | Wu | |
| 4,618,878 A | 10/1986 | Aoyama et al. | |
| 4,685,998 A | 8/1987 | Quinn et al. | |
| 4,703,288 A | 10/1987 | Frye et al. | |
| 4,723,197 A | 2/1988 | Takiar et al. | |
| 4,753,896 A | 6/1988 | Matloubian | |
| 4,789,647 A | 12/1988 | Peters | |
| 4,830,974 A | 5/1989 | Chang et al. | |
| 4,840,923 A | 6/1989 | Flagello et al. | |
| 4,866,507 A | 9/1989 | Jacobs et al. | |
| 4,871,317 A | 10/1989 | Jones | |
| 4,881,144 A | 11/1989 | Yuito et al. | |
| 4,927,505 A | 5/1990 | Sharma et al. | |
| 4,962,058 A | 10/1990 | Cronin et al. | |
| 4,963,974 A | 10/1990 | Ushio et al. | |
| 4,975,386 A | 12/1990 | Rao | |
| 4,978,419 A | 12/1990 | Nanda et al. | |
| 4,980,034 A | 12/1990 | Volfson et al. | |
| 4,984,061 A | 1/1991 | Matsumoto | |
| 4,988,514 A | 1/1991 | Fukuyama et al. | |
| 5,003,062 A | 3/1991 | Yen | |
| 5,016,461 A | 5/1991 | Walker et al. | |
| 5,027,188 A | 6/1991 | Owada et al. | |
| 5,046,161 A | 9/1991 | Takada | |
| 5,060,045 A | 10/1991 | Owada et al. | |
| 5,060,050 A | 10/1991 | Tsuneoka et al. | |
| 5,061,985 A | 10/1991 | Meguro et al. | |
| 5,065,222 A | 11/1991 | Ishii | |
| 5,083,187 A | 1/1992 | Lamson et al. | |
| 5,091,289 A | 2/1992 | Cronin et al. | |
| 5,095,402 A | 3/1992 | Hernandez et al. | |
| 5,106,461 A | 4/1992 | Volfson et al. | |
| 5,108,950 A | 4/1992 | Wakabayashi et al. | |
| 5,109,267 A | 4/1992 | Koblinger et al. | |
| 5,110,762 A | 5/1992 | Nakahara et al. | |
| 5,111,276 A | 5/1992 | Hingarh et al. | |
| 5,114,780 A | 5/1992 | Mercer et al. | |
| 5,117,272 A | 5/1992 | Nomura et al. | |
| 5,130,457 A | 7/1992 | Sanders et al. | |
| 5,145,571 A | 9/1992 | Lane et al. | |
| 5,157,589 A | 10/1992 | Cole et al. | |
| 5,168,078 A | 12/1992 | Reisman et al. | |
| 5,169,680 A | 12/1992 | Ting et al. | |
| 5,194,928 A | 3/1993 | Cronin et al. | |
| 5,198,695 A | 3/1993 | Hanes et al. | |
| 5,212,403 A | 5/1993 | Nakanishi et al. | |
| 5,220,199 A | 6/1993 | Owada et al. | |
| 5,226,232 A | 7/1993 | Boyd | |
| 5,227,012 A | 7/1993 | Brandli et al. | |
| 5,227,013 A | 7/1993 | Kumar | |
| 5,229,221 A | 7/1993 | Donado et al. | |
| 5,231,751 A | 8/1993 | Sachdev | |
| 5,244,833 A | 9/1993 | Gansauge et al. | |
| 5,252,515 A | 10/1993 | Tsai | |
| 5,262,353 A | 11/1993 | Sun et al. | |
| 5,266,446 A | 11/1993 | Chang et al. | |
| 5,291,062 A | 3/1994 | Higgins, III | |
| 5,310,699 A | 5/1994 | Chikawa et al. | |
| 5,311,404 A | 5/1994 | Trask et al. | |
| 5,338,696 A | 8/1994 | Ilderem et al. | |
| 5,341,026 A | 8/1994 | Harada et al. | |
| 5,341,049 A | 8/1994 | Shimizu et al. | |
| 5,346,858 A | 9/1994 | Thomas et al. | |
| 5,357,403 A | 10/1994 | Haller et al. | |
| 5,360,524 A | 11/1994 | Hendel et al. | |
| 5,370,766 A | 12/1994 | Desaigoudar et al. | |
| 5,371,047 A | 12/1994 | Greco et al. | |
| 5,372,967 A | 12/1994 | Sundaram et al. | |
| 5,381,046 A | 1/1995 | Cederbaum et al. | |
| 5,384,274 A | 1/1995 | Kanehachi | |
| 5,384,488 A | 1/1995 | Golshan et al. | |
| 5,410,173 A | 4/1995 | Kikushima et al. | |
| 5,416,356 A | 5/1995 | Staudinger et al. | |
| 5,427,982 A | 6/1995 | Jun | |
| 5,434,751 A | 7/1995 | Cole, Jr. et al. | |
| 5,436,412 A | 7/1995 | Ahmad et al. | |
| 5,442,235 A | 8/1995 | Parrillo et al. | |
| 5,446,311 A | 8/1995 | Ewen et al. | |
| 5,468,984 A | 11/1995 | Efland et al. | |
| 5,468,997 A | 11/1995 | Imai et al. | |
| 5,470,259 A | 11/1995 | Kaufman et al. | |
| 5,470,789 A | 11/1995 | Misawa | |
| 5,476,726 A | 12/1995 | Harada et al. | |
| 5,478,773 A | 12/1995 | Dow et al. | |
| 5,478,781 A | 12/1995 | Bertin et al. | |
| 5,485,038 A | 1/1996 | Licari et al. | |
| 5,489,303 A | 2/1996 | Sasaki et al. | |
| 5,500,558 A | 3/1996 | Hayashide | |
| 5,501,006 A | 3/1996 | Gehman, Jr. et al. | |
| 5,502,337 A | 3/1996 | Nozaki | |
| 5,510,653 A | 4/1996 | Fujiki et al. | |
| 5,514,006 A | 5/1996 | Getselis et al. | |
| 5,514,892 A | 5/1996 | Countryman et al. | |
| 5,519,582 A | 5/1996 | Matsuzaki | |
| 5,532,512 A | 7/1996 | Fillion et al. | |
| 5,534,465 A | 7/1996 | Frye et al. | |
| 5,539,241 A | 7/1996 | Abidi et al. | |
| 5,545,909 A | 8/1996 | Williams et al. | |
| 5,548,099 A | 8/1996 | Cole, Jr. et al. | |
| 5,559,055 A | 9/1996 | Chang et al. | |
| 5,563,086 A | 10/1996 | Bertin et al. | |
| 5,563,762 A | 10/1996 | Leung et al. | |
| 5,576,680 A | 11/1996 | Ling | |
| 5,578,849 A | 11/1996 | Tadaki et al. | |
| 5,578,860 A | 11/1996 | Costa et al. | |
| 5,581,098 A | 12/1996 | Chang | |
| 5,587,338 A | 12/1996 | Tseng | |
| 5,598,028 A | 1/1997 | Losavio et al. | |
| 5,608,262 A | 3/1997 | Degani et al. | |
| 5,612,254 A | 3/1997 | Mu et al. | |
| 5,612,573 A | 3/1997 | Lewis et al. | |
| 5,629,240 A | 5/1997 | Malladi et al. | |
| 5,631,478 A | 5/1997 | Okumura | |
| 5,635,767 A | 6/1997 | Wenzel et al. | |
| 5,637,907 A | 6/1997 | Leedy | |
| 5,646,067 A | 7/1997 | Gaul | |
| 5,652,182 A | 7/1997 | Cleeves | |
| 5,654,216 A | 8/1997 | Adrian | |
| 5,654,589 A | 8/1997 | Huang | |
| 5,656,849 A | 8/1997 | Burghartz et al. | |
| 5,659,201 A | 8/1997 | Wollesen | |
| 5,665,639 A | 9/1997 | Seppala et al. | |
| 5,665,989 A | 9/1997 | Dangelo | |
| 5,682,062 A | 10/1997 | Gaul | |
| 5,686,560 A | 11/1997 | Lee | |
| 5,686,764 A | 11/1997 | Fulcher | |
| 5,691,248 A | 11/1997 | Cronin et al. | |
| 5,701,666 A | 12/1997 | DeHaven et al. | |
| 5,717,251 A | 2/1998 | Hayashi et al. | |
| 5,719,448 A | 2/1998 | Ichikawa | |
| 5,723,822 A | 3/1998 | Lien | |
| 5,726,098 A | 3/1998 | Tsuboi | |
| 5,726,499 A | 3/1998 | Irinoda | |
| 5,739,560 A | 4/1998 | Toyoda et al. | |
| 5,742,075 A | 4/1998 | Burns et al. | |
| 5,742,100 A | 4/1998 | Schroeder et al. | |
| 5,759,906 A | 6/1998 | Lou | |
| 5,760,429 A | 6/1998 | Yano et al. | |
| 5,763,936 A | 6/1998 | Yamaha et al. | |
| 5,763,954 A | 6/1998 | Hyakutake | |
| 5,767,010 A | 6/1998 | Mis et al. | |
| 5,767,546 A | 6/1998 | Williams et al. | |
| 5,767,564 A | 6/1998 | Kunimatsu et al. | |
| 5,773,888 A | 6/1998 | Hosomi et al. | |
| 5,780,882 A | 7/1998 | Sugiura et al. | |
| 5,783,483 A | 7/1998 | Gardner | |

| | | | | | | |
|---|---|---|---|---|---|---|
| 5,783,868 A | 7/1998 | Galloway | | 6,004,841 A | 12/1999 | Chang et al. |
| 5,789,302 A | 8/1998 | Mitwalsky et al. | | 6,008,102 A | 12/1999 | Alford et al. |
| 5,789,303 A | 8/1998 | Leung et al. | | 6,008,542 A | 12/1999 | Takamori |
| 5,789,783 A | 8/1998 | Choudhury et al. | | 6,011,314 A | 1/2000 | Leibovitz et al. |
| 5,792,594 A | 8/1998 | Brown et al. | | 6,015,751 A | 1/2000 | Liu |
| 5,798,568 A | 8/1998 | Abercrombie et al. | | 6,016,000 A | 1/2000 | Moslehi |
| 5,807,783 A | 9/1998 | Gaul | | 6,018,183 A | 1/2000 | Hsu |
| 5,817,541 A | 10/1998 | Averkiou et al. | | 6,020,640 A | 2/2000 | Efland et al. |
| 5,818,110 A | 10/1998 | Cronin | | 6,022,792 A | 2/2000 | Ishii et al. |
| 5,818,111 A | 10/1998 | Jeng et al. | | 6,023,407 A | 2/2000 | Farooq et al. |
| 5,821,168 A | 10/1998 | Jain | | 6,025,261 A | 2/2000 | Farrar et al. |
| 5,827,776 A | 10/1998 | Bandyopadhyay et al. | | 6,025,275 A | 2/2000 | Efland et al. |
| 5,827,778 A | 10/1998 | Yamada | | 6,025,639 A | 2/2000 | Mitwalsky et al. |
| 5,827,780 A | 10/1998 | Hsia et al. | | 6,030,877 A | 2/2000 | Lee et al. |
| 5,834,844 A | 11/1998 | Akagawa et al. | | 6,031,257 A | 2/2000 | Noto et al. |
| 5,834,845 A | 11/1998 | Stolmeijer | | 6,031,293 A | 2/2000 | Hsuan et al. |
| 5,834,851 A | 11/1998 | Ikeda et al. | | 6,031,445 A | 2/2000 | Marty et al. |
| 5,838,023 A | 11/1998 | Goel et al. | | 6,033,939 A | 3/2000 | Agarwala et al. |
| 5,838,043 A | 11/1998 | Yuan | | 6,036,809 A | 3/2000 | Kelly et al. |
| 5,843,839 A | 12/1998 | Ng | | 6,037,664 A | 3/2000 | Zhao et al. |
| 5,847,464 A | 12/1998 | Singh et al. | | 6,040,226 A | 3/2000 | Wojnarowski et al. |
| 5,847,466 A | 12/1998 | Ito et al. | | 6,040,604 A | 3/2000 | Lauvray et al. |
| 5,854,513 A | 12/1998 | Kim et al. | | 6,043,430 A | 3/2000 | Chun |
| 5,858,869 A | 1/1999 | Chen et al. | | 6,046,502 A | 4/2000 | Matsuno et al. |
| 5,861,328 A | 1/1999 | Tehrani et al. | | 6,046,503 A | 4/2000 | Weigand et al. |
| 5,861,673 A | 1/1999 | Yoo et al. | | 6,060,385 A | 5/2000 | Givens |
| 5,861,675 A | 1/1999 | Sasaki et al. | | 6,064,758 A | 5/2000 | Jin |
| 5,869,901 A | 2/1999 | Kusuyama | | 6,066,877 A | 5/2000 | Williams et al. |
| 5,874,327 A | 2/1999 | Rostoker et al. | | 6,071,806 A | 6/2000 | Wu et al. |
| 5,874,770 A | 2/1999 | Saia et al. | | 6,071,809 A | 6/2000 | Zhao |
| 5,874,778 A | 2/1999 | Bhattacharyya et al. | | 6,075,290 A | 6/2000 | Schaefer et al. |
| 5,874,779 A | 2/1999 | Matsuno | | 6,077,726 A | 6/2000 | Mistry et al. |
| 5,883,422 A | 3/1999 | Anand et al. | | 6,084,284 A | 7/2000 | Adamic, Jr. |
| 5,883,423 A | 3/1999 | Patwa et al. | | 6,087,250 A | 7/2000 | Hyakutake |
| 5,883,435 A | 3/1999 | Geffken et al. | | 6,100,184 A | 8/2000 | Zhao et al. |
| 5,884,990 A | 3/1999 | Burghartz et al. | | 6,100,548 A | 8/2000 | Nguyen et al. |
| 5,885,862 A | 3/1999 | Jao et al. | | 6,100,590 A | 8/2000 | Yegnashankaran et al. |
| 5,886,410 A | 3/1999 | Chiang et al. | | 6,103,552 A | 8/2000 | Lin |
| 5,886,414 A | 3/1999 | Galloway | | 6,107,674 A | 8/2000 | Zommer |
| 5,888,884 A | 3/1999 | Wojnarowski | | 6,111,317 A | 8/2000 | Okada et al. |
| 5,889,302 A | 3/1999 | Liu | | 6,114,233 A | 9/2000 | Yeh |
| 5,892,273 A | 4/1999 | Iwasaki et al. | | 6,124,198 A | 9/2000 | Moslehi |
| 5,894,170 A | 4/1999 | Ishikawa | | 6,124,912 A | 9/2000 | Moore |
| 5,900,668 A | 5/1999 | Wollesen | | 6,130,457 A | 10/2000 | Yu et al. |
| 5,910,020 A | 6/1999 | Yamada | | 6,130,481 A | 10/2000 | Harada et al. |
| 5,915,169 A | 6/1999 | Heo | | 6,133,079 A | 10/2000 | Zhu et al. |
| 5,920,790 A | 7/1999 | Wetzel et al. | | 6,133,582 A | 10/2000 | Osann, Jr. et al. |
| 5,924,005 A | 7/1999 | Waldo | | 6,133,635 A | 10/2000 | Bothra et al. |
| 5,925,933 A | 7/1999 | Colgan et al. | | 6,136,212 A | 10/2000 | Mastrangelo et al. |
| 5,929,508 A | 7/1999 | Delgado et al. | | 6,137,155 A | 10/2000 | Seshan et al. |
| 5,929,525 A | 7/1999 | Lin | | 6,140,197 A | 10/2000 | Chu et al. |
| 5,934,636 A | 8/1999 | Cyrell | | 6,140,241 A | 10/2000 | Shue et al. |
| 5,934,844 A | 8/1999 | Woolley | | 6,143,646 A | 11/2000 | Wetzel |
| 5,939,790 A | 8/1999 | Gregoire et al. | | 6,144,100 A | 11/2000 | Shen et al. |
| 5,944,537 A | 8/1999 | Smith et al. | | 6,146,958 A | 11/2000 | Zhao et al. |
| 5,945,709 A | 8/1999 | Williams et al. | | 6,146,985 A | 11/2000 | Wollesen |
| 5,952,726 A | 9/1999 | Liang | | 6,147,857 A | 11/2000 | Worley et al. |
| 5,953,626 A | 9/1999 | Hause et al. | | 6,150,725 A | 11/2000 | Misawa et al. |
| 5,955,781 A | 9/1999 | Joshi et al. | | 6,150,726 A | 11/2000 | Feilchenfeld et al. |
| 5,959,357 A | 9/1999 | Korman | | 6,153,511 A | 11/2000 | Watatani |
| 5,959,424 A | 9/1999 | Elkmann et al. | | 6,153,521 A | 11/2000 | Cheung et al. |
| 5,959,997 A | 9/1999 | Moura et al. | | 6,160,297 A | 12/2000 | Shimizu et al. |
| 5,960,306 A | 9/1999 | Hall et al. | | 6,165,899 A | 12/2000 | Matumoto |
| 5,960,308 A | 9/1999 | Akagawa et al. | | 6,168,974 B1 | 1/2001 | Chang et al. |
| 5,963,840 A | 10/1999 | Xia et al. | | 6,169,019 B1 | 1/2001 | Takagi |
| 5,965,903 A | 10/1999 | Chittipeddi et al. | | 6,169,319 B1 | 1/2001 | Malinovich et al. |
| 5,969,422 A | 10/1999 | Ting et al. | | 6,174,393 B1 | 1/2001 | Scheifele |
| 5,969,424 A | 10/1999 | Matsuki et al. | | 6,174,803 B1 | 1/2001 | Harvey |
| 5,970,376 A | 10/1999 | Chen | | 6,175,156 B1 | 1/2001 | Mametani et al. |
| 5,973,374 A | 10/1999 | Longcor | | 6,180,426 B1 | 1/2001 | Lin |
| 5,985,762 A | 11/1999 | Geffken et al. | | 6,180,445 B1 | 1/2001 | Tsai |
| 5,986,343 A | 11/1999 | Chittipeddi et al. | | 6,184,138 B1 | 2/2001 | Ho et al. |
| 5,986,764 A | 11/1999 | Nonaka | | 6,184,143 B1 | 2/2001 | Ohashi et al. |
| 5,989,991 A | 11/1999 | Lien | | 6,184,159 B1 | 2/2001 | Lou et al. |
| 5,994,766 A | 11/1999 | Shenoy et al. | | 6,184,574 B1 | 2/2001 | Bissey |
| 6,001,538 A | 12/1999 | Chen et al. | | 6,187,680 B1 | 2/2001 | Costrini et al. |
| 6,001,673 A | 12/1999 | Marcinkiewicz | | 6,191,468 B1 | 2/2001 | Forbes et al. |
| 6,002,161 A | 12/1999 | Yamazaki | | 6,197,688 B1 | 3/2001 | Simpson |
| 6,004,831 A | 12/1999 | Yamazaki et al. | | 6,200,855 B1 | 3/2001 | Lee |

| | | |
|---|---|---|
| 6,200,888 B1 | 3/2001 | Ito et al. |
| 6,204,074 B1 | 3/2001 | Bertolet et al. |
| 6,207,486 B1 | 3/2001 | Nishiyama |
| 6,207,543 B1 | 3/2001 | Harvey et al. |
| 6,207,553 B1 | 3/2001 | Buynoski et al. |
| 6,214,630 B1 | 4/2001 | Hsuan et al. |
| 6,218,223 B1 | 4/2001 | Ikeda et al. |
| 6,218,302 B1 | 4/2001 | Braeckelmann et al. |
| 6,218,318 B1 | 4/2001 | Ohkura et al. |
| 6,221,727 B1 | 4/2001 | Chan et al. |
| 6,222,210 B1 | 4/2001 | Cerny et al. |
| 6,222,212 B1 | 4/2001 | Lee et al. |
| 6,229,221 B1 | 5/2001 | Kloen et al. |
| 6,232,147 B1 | 5/2001 | Matsuki et al. |
| 6,235,628 B1 | 5/2001 | Wang et al. |
| 6,236,101 B1 | 5/2001 | Erdeljac et al. |
| 6,240,541 B1 | 5/2001 | Yasuda et al. |
| 6,242,339 B1 | 6/2001 | Aoi |
| 6,242,791 B1 | 6/2001 | Jou |
| 6,245,594 B1 | 6/2001 | Wu et al. |
| 6,245,662 B1 | 6/2001 | Naik et al. |
| 6,245,663 B1 | 6/2001 | Zhao et al. |
| 6,255,714 B1 | 7/2001 | Kossives et al. |
| 6,255,737 B1 | 7/2001 | Hashimoto |
| 6,259,593 B1 | 7/2001 | Moriwaki et al. |
| 6,261,944 B1 | 7/2001 | Mehta et al. |
| 6,261,947 B1 | 7/2001 | McTeer |
| 6,265,301 B1 | 7/2001 | Lee et al. |
| 6,267,290 B1 | 7/2001 | Murdeshwar |
| 6,268,657 B1 | 7/2001 | Watanabe et al. |
| 6,272,736 B1 | 8/2001 | Lee |
| 6,278,174 B1 | 8/2001 | Havemann et al. |
| 6,287,893 B1 | 9/2001 | Elenius et al. |
| 6,288,442 B1 | 9/2001 | Farrar |
| 6,288,447 B1 | 9/2001 | Amishiro et al. |
| 6,294,451 B1 | 9/2001 | Yoshizawa |
| 6,300,234 B1 | 10/2001 | Flynn et al. |
| 6,300,235 B1 | 10/2001 | Feldner et al. |
| 6,303,423 B1 | 10/2001 | Lin |
| 6,303,977 B1 | 10/2001 | Schroen et al. |
| 6,306,749 B1 | 10/2001 | Lin |
| 6,324,048 B1 | 11/2001 | Liu |
| 6,326,673 B1 | 12/2001 | Liou |
| 6,330,234 B1 | 12/2001 | Tomasi et al. |
| 6,335,104 B1 | 1/2002 | Sambucetti et al. |
| 6,336,269 B1 | 1/2002 | Eldridge et al. |
| 6,346,471 B1 | 2/2002 | Okushima |
| 6,348,733 B1 | 2/2002 | Lin |
| 6,350,705 B1 | 2/2002 | Lin |
| 6,352,917 B1 | 3/2002 | Gupta et al. |
| 6,355,969 B1 | 3/2002 | Skala et al. |
| 6,359,328 B1 | 3/2002 | Dubin |
| 6,362,087 B1 | 3/2002 | Wang et al. |
| 6,362,527 B1 * | 3/2002 | Mehta .......................... 257/758 |
| 6,365,975 B1 * | 4/2002 | DiStefano et al. ............ 257/777 |
| 6,370,768 B1 | 4/2002 | Itabashi |
| 6,376,353 B1 | 4/2002 | Zhou et al. |
| 6,376,374 B1 | 4/2002 | Stevens |
| 6,380,626 B1 | 4/2002 | Jiang |
| 6,383,916 B1 | 5/2002 | Lin |
| 6,392,300 B1 | 5/2002 | Koike |
| 6,395,454 B1 | 5/2002 | Piscevic |
| 6,399,478 B2 | 6/2002 | Matsubara et al. |
| 6,399,482 B1 | 6/2002 | Lou |
| 6,399,997 B1 | 6/2002 | Lin et al. |
| 6,410,435 B1 | 6/2002 | Ryan |
| 6,417,572 B1 | 7/2002 | Chidambarrao et al. |
| 6,417,575 B2 | 7/2002 | Harada et al. |
| 6,420,773 B1 | 7/2002 | Liou |
| 6,426,562 B2 | 7/2002 | Farnworth |
| 6,429,120 B1 | 8/2002 | Ahn et al. |
| 6,429,764 B1 | 8/2002 | Karam et al. |
| 6,436,814 B1 | 8/2002 | Horak et al. |
| 6,440,750 B1 | 8/2002 | Feygenson et al. |
| 6,440,863 B1 | 8/2002 | Tsai et al. |
| 6,441,487 B2 | 8/2002 | Elenius et al. |
| 6,441,715 B1 | 8/2002 | Johnson |
| 6,452,274 B1 | 9/2002 | Hasegawa et al. |
| 6,455,880 B1 | 9/2002 | Ono et al. |
| 6,455,885 B1 | 9/2002 | Lin |
| 6,459,135 B1 | 10/2002 | Basteres et al. |
| 6,461,895 B1 | 10/2002 | Liang et al. |
| 6,472,253 B1 | 10/2002 | Bothra |
| 6,472,308 B1 | 10/2002 | Mehta |
| 6,472,745 B1 | 10/2002 | Iizuka |
| 6,475,898 B1 | 11/2002 | Napolitano |
| 6,475,904 B2 | 11/2002 | Okoroanyanwu et al. |
| 6,489,647 B1 | 12/2002 | Lin |
| 6,495,442 B1 | 12/2002 | Lin et al. |
| 6,504,236 B2 | 1/2003 | Bissey |
| 6,518,092 B2 | 2/2003 | Kikuchi |
| 6,531,779 B1 | 3/2003 | Oda |
| 6,538,326 B2 | 3/2003 | Shimizu et al. |
| 6,544,880 B1 | 4/2003 | Akram |
| 6,545,354 B1 | 4/2003 | Aoki et al. |
| 6,545,355 B2 | 4/2003 | Yanagida et al. |
| 6,555,459 B1 | 4/2003 | Tokushige et al. |
| 6,559,409 B1 | 5/2003 | Cadet |
| 6,566,737 B2 | 5/2003 | Bohr |
| 6,577,007 B1 | 6/2003 | Mehta |
| 6,578,754 B1 | 6/2003 | Tung |
| 6,583,043 B2 | 6/2003 | Shroff et al. |
| 6,593,222 B2 | 7/2003 | Smoak |
| 6,593,649 B1 | 7/2003 | Lin et al. |
| 6,605,524 B1 | 8/2003 | Fan et al. |
| 6,605,549 B2 | 8/2003 | Leu et al. |
| 6,605,873 B1 | 8/2003 | Vigna et al. |
| 6,607,975 B1 | 8/2003 | Agarwal |
| 6,614,091 B1 | 9/2003 | Downey et al. |
| 6,614,099 B2 | 9/2003 | Farrar |
| 6,620,728 B2 | 9/2003 | Lin |
| 6,639,299 B2 | 10/2003 | Aoki |
| 6,646,347 B2 | 11/2003 | Mercado et al. |
| 6,649,509 B1 | 11/2003 | Lin et al. |
| 6,649,533 B1 | 11/2003 | Iacoponi |
| 6,653,563 B2 | 11/2003 | Bohr |
| 6,657,310 B2 | 12/2003 | Lin |
| 6,673,704 B2 | 1/2004 | Wada et al. |
| 6,680,544 B2 | 1/2004 | Lu et al. |
| 6,683,380 B2 | 1/2004 | Efland et al. |
| 6,703,286 B1 | 3/2004 | Yu et al. |
| 6,707,124 B2 | 3/2004 | Wachtler et al. |
| 6,707,159 B1 | 3/2004 | Kumamoto et al. |
| 6,709,973 B1 | 3/2004 | Sakamoto |
| 6,710,460 B2 | 3/2004 | Morozumi |
| 6,713,381 B2 | 3/2004 | Barr et al. |
| 6,717,159 B2 | 4/2004 | Novak |
| 6,720,212 B2 | 4/2004 | Robl et al. |
| 6,720,659 B1 | 4/2004 | Akahori |
| 6,756,295 B2 | 6/2004 | Lin et al. |
| 6,756,675 B1 | 6/2004 | Tanaka |
| 6,759,597 B2 | 7/2004 | Cutting et al. |
| 6,762,115 B2 | 7/2004 | Lin et al. |
| 6,774,489 B2 | 8/2004 | Russell et al. |
| 6,780,748 B2 | 8/2004 | Yamaguchi et al. |
| 6,798,050 B2 | 9/2004 | Homma et al. |
| 6,798,073 B2 | 9/2004 | Lin et al. |
| 6,800,555 B2 | 10/2004 | Test et al. |
| 6,818,540 B2 | 11/2004 | Saran et al. |
| 6,818,546 B2 | 11/2004 | Saito et al. |
| 6,821,896 B1 | 11/2004 | Shih |
| 6,838,769 B1 | 1/2005 | Chittipeddi et al. |
| 6,844,631 B2 | 1/2005 | Yong et al. |
| 6,861,740 B2 | 3/2005 | Hsu |
| 6,864,562 B1 | 3/2005 | Toyosawa et al. |
| 6,882,045 B2 | 4/2005 | Massingill et al. |
| 6,900,545 B1 | 5/2005 | Sebesta et al. |
| 6,906,418 B2 | 6/2005 | Hiatt et al. |
| 6,943,440 B2 | 9/2005 | Kim et al. |
| 6,952,042 B2 | 10/2005 | Stratton et al. |
| 6,958,547 B2 | 10/2005 | Dubin et al. |
| 6,963,136 B2 | 11/2005 | Shinozaki et al. |
| 6,965,165 B2 | 11/2005 | Lin |
| 6,979,647 B2 | 12/2005 | Bojkov et al. |
| 6,979,871 B2 | 12/2005 | Ahn et al. |
| 6,984,891 B2 | 1/2006 | Ahn et al. |
| 7,057,289 B2 | 6/2006 | Farrar |
| 7,061,111 B2 | 6/2006 | McTeer |

| | | |
|---|---|---|
| 7,091,616 B2 | 8/2006 | Suminoe et al. |
| 7,170,115 B2 | 1/2007 | Tokunaga et al. |
| 7,224,063 B2 | 5/2007 | Agarwala et al. |
| 7,239,028 B2 | 7/2007 | Anzai |
| 7,294,870 B2 * | 11/2007 | Lin .............................. 257/211 |
| 7,294,871 B2 | 11/2007 | Lin |
| 7,294,879 B2 | 11/2007 | Chen et al. |
| 7,323,717 B2 | 1/2008 | Koyama et al. |
| 7,329,954 B2 | 2/2008 | Lin |
| 7,358,610 B2 | 4/2008 | Lin |
| 7,368,376 B2 | 5/2008 | Lin |
| 7,372,085 B2 | 5/2008 | Lin |
| 7,372,155 B2 | 5/2008 | Lin |
| 7,382,058 B2 | 6/2008 | Lin |
| 7,384,864 B2 | 6/2008 | Lin |
| 7,385,291 B2 | 6/2008 | Lin |
| 7,385,292 B2 * | 6/2008 | Lin .............................. 257/758 |
| 7,388,292 B2 | 6/2008 | Lin |
| 7,396,756 B2 * | 7/2008 | Lin .............................. 438/618 |
| 7,397,135 B2 * | 7/2008 | Lin .............................. 257/778 |
| 7,422,976 B2 | 9/2008 | Lin |
| 7,425,764 B2 * | 9/2008 | Lin .............................. 257/758 |
| 7,442,969 B2 * | 10/2008 | Lin .............................. 257/211 |
| 7,456,100 B2 | 11/2008 | Lin |
| 7,465,975 B2 * | 12/2008 | Lin .............................. 257/211 |
| 7,482,693 B2 | 1/2009 | Lin |
| 2001/0000928 A1 | 5/2001 | Lee et al. |
| 2001/0008301 A1 | 7/2001 | Terui |
| 2001/0016410 A1 | 8/2001 | Cheng et al. |
| 2001/0017417 A1 | 8/2001 | Kuroda |
| 2001/0019168 A1 | 9/2001 | Willer et al. |
| 2001/0028098 A1 | 10/2001 | Liou |
| 2001/0035452 A1 | 11/2001 | Test et al. |
| 2001/0035586 A1 | 11/2001 | Nakamura et al. |
| 2001/0051426 A1 | 12/2001 | Pozder et al. |
| 2002/0000665 A1 | 1/2002 | Barr et al. |
| 2002/0000671 A1 | 1/2002 | Zuniga et al. |
| 2002/0008301 A1 | 1/2002 | Liou et al. |
| 2002/0008967 A1 | 1/2002 | Feustel et al. |
| 2002/0017230 A1 | 2/2002 | Bergquist et al. |
| 2002/0017730 A1 | 2/2002 | Tahara et al. |
| 2002/0024142 A1 | 2/2002 | Sekiguchi |
| 2002/0043723 A1 | 4/2002 | Shimizu et al. |
| 2002/0050626 A1 | 5/2002 | Onuma et al. |
| 2002/0064922 A1 | 5/2002 | Lin |
| 2002/0089062 A1 | 7/2002 | Saran et al. |
| 2002/0119623 A1 | 8/2002 | Park |
| 2002/0123228 A1 | 9/2002 | Smoak et al. |
| 2002/0123872 A1 | 9/2002 | Okada |
| 2002/0158334 A1 | 10/2002 | Vu et al. |
| 2003/0037959 A1 | 2/2003 | Master et al. |
| 2003/0076209 A1 | 4/2003 | Tsai et al. |
| 2003/0102551 A1 | 6/2003 | Kikuchi |
| 2003/0214041 A1 | 11/2003 | Suzuki et al. |
| 2003/0218246 A1 | 11/2003 | Abe et al. |
| 2004/0023450 A1 | 2/2004 | Katagiri et al. |
| 2004/0137153 A1 | 7/2004 | Thomas et al. |
| 2004/0158758 A1 | 8/2004 | Zarkesh-Ha et al. |
| 2004/0188837 A1 | 9/2004 | Kim et al. |
| 2004/0219783 A1 | 11/2004 | Ahn et al. |
| 2005/0158982 A1 | 7/2005 | Kanamura |
| 2005/0260849 A1 | 11/2005 | Lin |
| 2005/0266612 A1 | 12/2005 | Lin |
| 2006/0163734 A1 | 7/2006 | Thei et al. |
| 2007/0278691 A1 | 12/2007 | Lin |
| 2007/0281458 A1 | 12/2007 | Lin |
| 2007/0281463 A1 | 12/2007 | Lin |
| 2007/0281467 A1 | 12/2007 | Lin |
| 2007/0281468 A1 | 12/2007 | Lin |
| 2007/0290351 A1 | 12/2007 | Lin |
| 2007/0290353 A1 | 12/2007 | Lin |
| 2007/0293036 A1 | 12/2007 | Lin |
| 2007/0293037 A1 | 12/2007 | Lin |
| 2008/0050909 A1 | 2/2008 | Lin et al. |
| 2008/0083987 A1 | 4/2008 | Lin |
| 2008/0083988 A1 | 4/2008 | Lin |
| 2008/0128910 A1 | 6/2008 | Lin |

FOREIGN PATENT DOCUMENTS

| | | |
|---|---|---|
| EP | 1039544 | 9/2000 |
| GB | 1343822 | 1/1974 |
| GB | 1543845 | 4/1979 |
| JP | 01-135043 | 5/1989 |
| JP | 01-183836 | 7/1989 |
| JP | 01-184848 | 7/1989 |
| JP | 01-184849 | 7/1989 |
| JP | 01209746 A * | 8/1989 |
| JP | 04-316351 | 11/1992 |
| JP | 4363058 | 12/1992 |
| JP | 2000114371 | 4/2000 |
| JP | 2000216264 | 8/2000 |
| JP | 2002270686 | 9/2002 |

OTHER PUBLICATIONS

Stanley Wolf, Silicon Processing for the VLSI Era vol. 2: Process Integration, Lattice Press, Sunset Beach, CA, USA copyright 1990, pp. 214-217, 282-285.

Stanley Wolf, Silicon Processing for the VLSI Era vol. 2: Process Integration, Lattice Press, Sunset Beach, CA, pp. 214-285,Copyright 1990.

Zhao, B. Biberger, et al., "A novel sub-half micron Al-Cu via plug interconnect using low dielectric constant material as inter-level dielectric," Electron Device Letters, IEEE. vol. 18:2, pp. 57-59. Feb. 1997.

Caterer, D. et al. "Processing Thick Multilevel Polymide Films for 3-D Stacked Memory," IEEE Transactions on Advanced Packing, vol. 22, Issue 2, pp. 189-199 (May 1999).

Cote, et al. "Boron Nitride Self Aligned Stud Dual Damascene Process," (Feb. 1, 1992).

Luby, S. "Metallization Films and Systems for Semiconductor Devices and Circuits: Some Problems and Trends," Vacuum, vol. 37, N 1-2, p. 190 (1985).

Song, W. S. et al. "Power Distribution Techniques for VLSI Circuits," IEEE Journal of Solid-State Circuits, vol. 21, Issue 1, p. 150 (Feb. 1986).

Yuan, H. et al. "Properties of Interconnection on Silicon, Sapphire and Semi-Insulating Gallium Arsenide Substrates," IEEE Transactions on Electron Devices, vol. 29, N 4, pp. 639-644 (Apr. 1982).

Mistry, K. et al. "A 45nm Logic Technology with High-k+ Metal Gate Transistors, Strained Silicon, 9 Cu Interconnect Layers, 193nm Dry Patterning, and 100% Pb-free Packaging," IEEE International Electron Devices Meeting (2007) pp. 247-250.

Edelstein, D.C., "Advantages of Copper Interconnects," Proceedings of the 12th International IEEE VLSI Multilevel Interconnection Conference (1995) pp. 301-307.

Theng, C. et al. "An Automated Tool Deployment for ESD (Electro-Static-Discharge) Correct-by-Construction Strategy in 90 nm Process," IEEE International Conference on Semiconductor Electronics (2004) pp. 61-67.

Gao, X. et al. "An improved electrostatic discharge protection structure for reducing triggering voltage and parasitic capacitance," Solid-State Electronics, 27 (2003), pp. 1105-1110.

Yeoh, A. et al. "Copper Die Bumps (First Level Interconnect) and Low-K Dielectrics in 65nm High Volume Manufacturing," Electronic Components and Technology Conference (2006) pp. 1611-1615.

Hu, C-K. et al. "Copper-Polyimide Wiring Technology for VLSI Circuits," Materials Research Society Symposium Proceedings VLSI V (1990) pp. 369-373.

Roesch, W. et al. "Cycling copper flip chip interconnects," Microelectronics Reliability, 44 (2004) pp. 1047-1054.

Lee, Y-H. et al. "Effect of ESD Layout on the Assembly Yield and Reliability," International Electron Devices Meeting (2006) pp. 1-4.

Yeoh, T-S. "ESD Effects On Power Supply Clamps," Proceedings of the 6th International Symposium on Physical & Failure Analysis of Integrated Circuits (1997) pp. 121-124.

Edelstein, D. et al. "Full Copper Wiring in a Sub-0.25 pm CMOS ULSI Technology," Technical Digest IEEE International Electron Devices Meeting (1997) pp. 773-776.

Venkatesan, S. et al. "A High Performance 1.8V, 0.20 pm CMOS Technology with Copper Metallization," Technical Digest IEEE International Electron Devices Meeting (1997) pp. 769-772.

Jenei, S. et al. "High Q Inductor Add-on Module in Thick Cu/SILK™ single damascene," Proceedings from the IEEE International Interconnect Technology Conference (2001) pp. 107-109.

Groves, R. et al. "High Q Inductors in a SiGe BiCMOS Process Utilizing a Thick Metal Process Add-on Module," Proceedings of the Bipolar/BiCMOS Circuits and Technology Meeting (1999) pp. 149-152.

Sakran, N. et al. "The Implementation of the 65nm Dual-Core 64b Merom Processor," IEEE International Solid-State Circuits Conference, Session 5, Microprocessors, 5.6 (2007) pp. 106-107, p. 590.

Kumar, R. et al. "A Family of 45nm IA Processors," IEEE International Solid-State Circuits Conference, Session 3, Microprocessor Technologies, 3.2 (2009) pp. 58-59.

Bohr, M. "The New Era of Scaling in an SoC World," International Solid-State Circuits Conference (2009) Presentation Slides 1-66.

Bohr, M. "The New Era of Scaling in an SoC World," International Solid-State Circuits Conference (2009) pp. 23-28.

Ingerly, D. et al. "Low-K Interconnect Stack with Thick MEtal 9 Redistrubution Layer and Cu Die Bump for 45nm High Volume Manufacturing," International Interconnect Technology Conference (2008) pp. 216-218.

Kurd, N. et al. "Next Generation Intel® Micro-architecture (Nehalem) Clocking Architecture," Symposium on VLSI Circuits Digest of Technical Papers (2008) pp. 62-63.

Maloney, T. et al. "Novel Clamp Circuits for Ic Power Supply Protection," IEEE Transactions on Components, Packaging, and Manufacturing Technology, Part C, vol. 19, No. 3 (Jul. 1996) pp. 150-161.

Geffken, R. M. "An Overview of Polyimide Use in Integrated Circuits and Packaging,"Proceedings of the Third International Symposium on Ultra Large Scale Integration Science and Technology (1991) pp. 667-677.

Luther, B. et al. "Planar Copper-Polyimide Back End of the Line Interconnections for ULSI Devices," Proceedings of the 10th International IEEE VLSI Multilevel Interconnection Conference (1993) pp. 15-21.

Master, R. et al. "Ceramic Mini-Ball Grid Array Package for High Speed Device," Proceedings from the 45th Electronic Components and Technology Conference (1995) pp. 46-50.

Maloney, T. et al. "Stacked PMOS Clamps for High Voltage Power Supply Protection," Electrical Overstress/Electrostatic Discharge Symposium Proceedings (1999) pp. 70-77.

Lin, M.S. et al. "A New System-on-a-Chip (SOC) Technology-High Q Post Passivation Inductors," Proceedings from the 53rd Electronic Components and Technology Conference (May 30, 2003) pp. 1503-1509.

MEGIC Corp. "MEGIC way to system solutions through bumping and redistribution," (Brochure) (Feb. 6, 2004) pp. 1-3.

Lin, M.S. "Post Passivation Technology™ -MEGIC ® Way to System Solutions," Presentation given at TSMC Technology Symposium, Japan (Oct. 1, 2003) pp. 1-32.

Lin, M.S. et al. "A New IC Interconnection Scheme and Design Architecture for High Performance ICs at Very Low Fabrication Cost—Post Passivation Interconnection," Proceedings of the IEEE Custom Integrated Circuits Conference (Sep. 24, 2003) pp. 533-536.

Sematech Dictionary of Semiconductor Terms, Definition of "Passivation", available at www.sematech.org, last visited Apr. 1, 2010, 2 pages.

Dow Corning, "Leading the Way to Ultra-low k" 2001, 4 pages.

Ezaki et al., "A 160Gb/s Interface Design Configuration for Multichip LSI", IEEE International Solid-State Circuits Conference 2004, Session 7, TD: Scaling Trends, 7.5 Jun. 2004, 8 pages.

Song et al., "Power Distribution Techniques for VLSI Circuits", IEEE Journal of Solid-State Circuits, vol. 21, Issue 1, pp. 150-156 (Feb. 1986).

Yuan et al., "Properties of Interconnection on Silicon, Sapphire and Semi-Insulating Gallium Arsenide Substrates", IEEE Journal of Solid State circuits, vol. SC-17, No. 2, pp. 269-274 (Apr. 1982).

* cited by examiner

TOP LAYERS OF METAL FOR HIGH PERFORMANCE IC'S

This application is a continuation of application Ser. No. 11/230,102, filed on Sep. 19, 2005, now U.S. Pat. No. 7,368,376, which is a continuation of application Ser. No. 11/121,477, filed on May 4, 2005, now U.S. Pat. No. 7,294,870, which is a continuation of application Ser. No. 10/389,543, filed on Mar. 14, 2003, now U.S. Pat. No. 6,965,165, which is a division of application Ser. No. 09/972,639, filed on Oct. 9, 2001, now U.S. Pat. No. 6,657,310, which is a division of application Ser. No. 09/251,183, filed on Feb. 17, 1999, now U.S. Pat. No. 6,383,916, which is a continuation-in-part of application Ser. No. 09/216,791, filed on Dec. 21, 1998, now abandoned.

BACKGROUND OF THE INVENTION (1) Field of the Invention

The invention relates to the manufacturing of high performance Integrated Circuit (IC's), and more specifically to methods of achieving high performance of the Integrated Circuits by reducing the parasitic capacitance and resistance of interconnecting wiring on a chip.

(2) Description of the Prior Art

When the geometric dimensions of the Integrated Circuits are scaled down, the cost per die is decreased while some aspects of performance are improved. The metal connections which connect the Integrated Circuit to other circuit or system components become of relative more importance and have, with the further miniaturization of the IC, an increasingly negative impact on the circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

To solve this problem, the approach has been taken to develop low resistance metal (such as copper) for the wires while low dielectric materials are used in between signal lines. Increased Input-Output (IO) combined with increased demands for high performance IC's has led to the development of Flip Chip Packages. Flip-chip technology fabricates bumps (typically Pb/Sn solders) on Al pads on chip and interconnect the bumps directly to the package media, which are usually ceramic or plastic based. The flip-chip is bonded face down to the package medium through the shortest path. These technologies can be applied not only to single-chip packaging, but also to higher or integrated levels of packaging in which the packages are larger and to more sophisticated substrates that accommodate several chips to form larger functional units.

The flip-chip technique, using an area array, has the advantage of achieving the highest density of interconnection to the device and a very low inductance interconnection to the package. However, pre-testability, post-bonding visual inspection, and TCE (Temperature Coefficient of Expansion) matching to avoid solder bump fatigue are still challenges. In mounting several packages together, such as surface mounting a ceramic package to a plastic board, the TCE mismatch can cause a large thermal stress on the solder-lead joints that can lead to joint breakage caused by solder fatigue from temperature cycling operations.

U.S. Pat. No. 5,212,403 (Nakanishi) shows a method of forming wiring connections both inside and outside (in a wiring substrate over the chip) for a logic circuit depending on the length of the wire connections.

U.S. Pat. No. 5,501,006 (Gehman, Jr. et al.) shows a structure with an insulating layer between the integrated circuit (IC) and the wiring substrate. A distribution lead connects the bonding pads of the IC to the bonding pads of the substrate.

U.S. Pat. No. 5,055,907 (Jacobs) discloses an extended integration semiconductor structure that allows manufacturers to integrate circuitry beyond the chip boundaries by forming a thin film multi-layer wiring decal on the support substrate and over the chip. However, this reference differs from the invention.

U.S. Pat. No. 5,106,461 (Volfson et al.) teaches a multi layer interconnect structure of alternating polyimide (dielectric) and metal layers over an IC in a TAB structure.

U.S. Pat. No. 5,635,767 (Wenzel et al.) teaches a method for reducing RC delay by a PBGA that separates multiple metal layers.

U.S. Pat. No. 5,686,764 (Fulcher) shows a flip chip substrate that reduces RC delay by separating the power and 1/0 traces.

SUMMARY OF THE INVENTION

It is the primary objective of the present invention to improve the performance of High Performance Integrated Circuits.

Another objective of the present invention is to reduce resistive voltage drop of the power supply lines that connect the IC to surrounding circuitry or circuit components.

Another objective of the present invention is to reduce the RC delay constant of the signal paths of high performance IC's.

Yet another objective of the present invention is to facilitate the application of IC's of reduced size and increased circuit density.

Yet another objective of the present invention is to further facilitate and enhance the application of low resistor conductor metals.

Yet another objective of the present invention is to allow for increased I/O pin count for the use of high performance IC's.

Yet another objective of the present invention is to simplify chip assembly by reducing the need for re-distribution of I/O chip connections.

Yet another objective of the present invention is to facilitate the connection of high-performance IC's to power buses.

Yet another objective of the present invention is to facilitate the connection of high-performance IC's to clock distribution networks.

Yet another objective of the present invention is to reduce IC manufacturing costs by allowing or facilitating the use of less expensive process equipment and by accommodating less strict application of clean room requirements, this as compared to sub-micron manufacturing requirements.

Yet another objective of the present invention is to be a driving force and stimulus for future system-on-chip designs since the present invention allows ready and cost effective interconnection between functional circuits that are positioned at relatively large distances from each other on the chip.

Yet another objective of the present design is to form the basis for a computer based routing tool that automatically routes interconnections that exceed a pre-determined length in accordance with the type of interconnection that needs to be established.

The present invention adds one or more thick layers of dielectric and one or more layers of wide metal lines on top of the finished device wafer. The thick layer of dielectric can, for example, be of polyimide or benzocyclobutene (BCB) with a thickness of over, for example, 3 um. The wide metal lines can, for instance, be of aluminum or electroplated copper. These layers of dielectric and metal lines can be used for power buses or power planes, clock distribution networks, critical signal, re-distribution of I/O pads for flip chip applications, and for long signal paths.

DETAILED DESCRIPTION OF THE INVENTION

The present invention teaches an Integrated Circuit structure where key re-distribution and interconnection metal layers and dielectric layers are added over a conventional IC. These re-distribution and interconnection layers allow for wider buses and reduce conventional RC delay.

Figure 1:
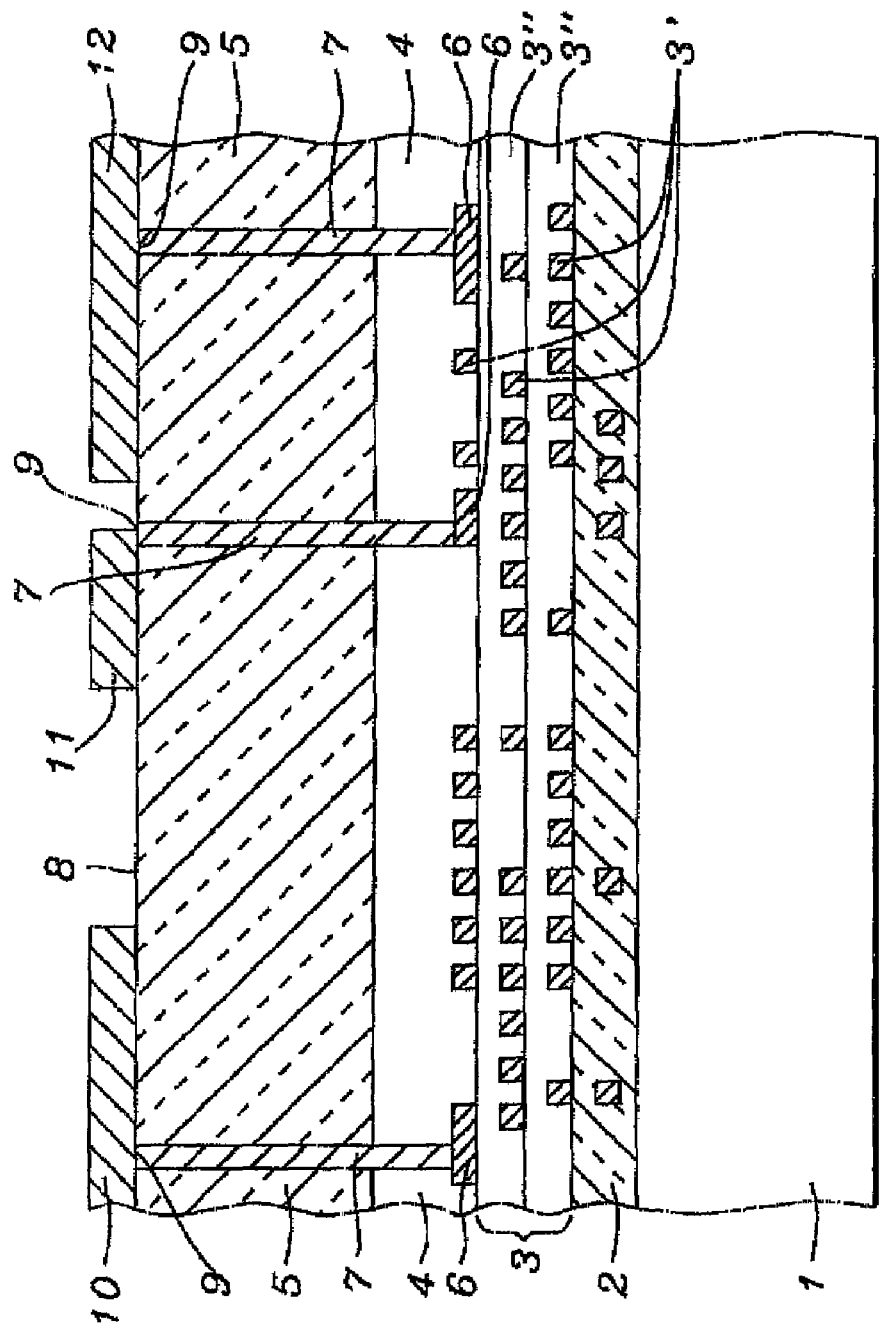
FIG. 1 shows a cross section of the interconnection scheme of the present invention.

Referring now more specifically to FIG. 1, there is shown a cross section of one implementation of the present invention. A silicon substrate 1 has transistors and other devices, typically formed of poly silicon, covered by a dielectric layer 2 deposited over the devices and the substrate. Layer 3 indicates the totality of metal layers 3' and dielectric layers 3" that me typically created on top of the device layer 2. Points of contact 6, such as bonding pads known in the semiconductor art, are in the top surface of layers 3' and are part of layer 3. These points of contact 6 are points within the IC arrangement that need to be further connected to surrounding circuitry, that is to power lines or to signal lines. A passivation layer 4, formed of for example silicon nitride, is deposited on top of layer 3, as is known in the art for protecting under lying layers horn moisture, contamination, etc.

The key steps of the invention begin with the deposition of a thick layer 5 of polyimide is deposited. A pattern 7 is exposed and etched through the polyimide layer 5 and the passivation layer 4 where the pattern 7 is the same as the pattern of the contact points 6. This opens the contact points 6 up to the surface 8 of the polyimide layer 5.

Electrical contact with the contact points 6 can now be established by filling the openings 7 with a conductor. The tops 9 of this metal conductor can now be used for connection of the IC to its environment, and for further integration into the surrounding electrical circuitry. Pads 10, 11 and 12 are formed on top of the top 9 of the metal conductors 7; these pads can be of any design in width and thickness to accommodate specific circuit design requirements. A larger size pad can, for instance, be used as a flip chip pad. A somewhat smaller in size pad can be used for power distribution or as a ground or signal bus. The following connections can, for instance, be made to the pads shown in FIG. 1: pad 10 can serve as a flip chip pad, pad 11 can serve as a flip chip pad or can be connected to electrical power or to electrical ground or to an electrical signal bus, pad 12 can also serve as a flip chip pad. There is no connection between the size of the pads shown in FIG. 1 and the suggested possible electrical connections for which this pad can be used. Pad size and the standard rules and restrictions of electrical circuit design determine the electrical connections to which a given pad lends itself.

The following comments relate to the size and the number of the contact points 6, FIG. 1. Because these contact points 6 are located on top of a thin dielectric (layer 3", FIG. 1) the pad size cannot be too large since a large pad size brings with it a large capacitance. In addition, a large pad size will interfere with the routing capability of that layer of metal. It is therefore preferred to keep the size of the pad 6 small. The size of pad 6 is however also directly related with the aspect ratio of via 7. An aspect ratio of about 5 is acceptable for the consideration of via etching and via filling. Based on these considerations, the size of the contact pad 6 can be in the order of 0.3 µm to 5.0 µm, the exact size being dependent on the thickness of layers 4 and 5. The contact points 6 can comprise any appropriate contact material, such as but not limited to tungsten, copper (electroplated or electroless), aluminum, polysilicon, or the like.

The present invention does not impose a limitation on the number of contact pads that can be included in the design; this number is dependent on package design requirements. Layer 4 in FIG. 1 can be a typical IC passivation layer.

The most frequently used passivation layer in the present state of the art is plasma enhanced CVD (PECVD) oxide and nitride. In creating layer 4, a layer of between about 0.15 and 2.0 µm PECVD oxide is deposited first followed by a layer of between about 0.5 and 2.0 µm, and preferably approximately 0.7 µm nitride. Passivation layer 4 is very important because it protects the device wafer from moisture and foreign ion contamination. The positioning of this layer between the sub-micron process (of the integrated circuit) and the tens-micron process (of the interconnecting metallization structure) is of critical importance since it allows for a cheaper process that possibly has less stringent clean room requirements for the process of creating the interconnecting metallization structure.

Layer 5 is a thick polymer dielectric layer (for example polyimide) that has a thickness in excess of 2 µm (after curing) The range of polyimide thickness can vary from 2 µm to 30 µm dependent on electrical design requirements.

For the deposition of layer 5 the Hitachi-Dupont polyimide HD 2732 or 2734 can, for example, be used. The polyimide can be spin-on coated and cured. After spin-on coating, the polyimide will be cured at between approximately 250 and 450 degrees C., preferably at 400 degrees C., for between approximately 0.5 and 1.5 hours, preferably for 1 hour, in a vacuum or nitrogen ambient. For thicker polyimide, the polyimide film can be multiple coated and cured.

Another material that can be used to create layer 5 is the polymer benzocyclobutene (BCB). This polymer is at this time commercially produced by for instance Dow Chemical and has recently gained acceptance to be used instead of typical polyimide application.

The dimensions of opening 7 have previously been discussed. The dimension of the opening together with the dielectric thickness determines the aspect ratio of the opening. The aspect ratio challenges the via etch process and the metal filling capability. This leads to a diameter for opening 7 in the range of approximately 0.5 µm to 3.0 µm while the height for opening 7 can be in the range of approximately 3 µm to 20 µm. The aspect ratio of opening 7 is designed such that filling of the via with metal can be accomplished. The via can be filled with CVD metal such as CVD tungsten or CVD copper, with electroless nickel, with a damascene metal filling process, with electroplating copper, with sputtering aluminum, etc.

It must be noted that the use of polyimide films as inter-level dielectrics has been pursued as a technique for providing partial planarization of a dielectric surface. Polyimides offer the following characteristics for such applications:

they produce surfaces in which the step heights of underlying features are reduced, and step slopes are gentle and smooth.

they are available to fill small openings without producing the voids that occur when low-temperature CVD oxide films are deposited.

the cured polyimide films can tolerate temperatures of up to 500 degrees C. without degradation of their dielectric film characteristics.

polyimide films have dielectric breakdowns, which are only slightly lower than that of $SiO_2$.

the dielectric constant of polyimides is smaller than that of silicon nitride and of $SiO_2$.

the process used to deposit and pattern polyimide films is relatively simple.

For all of the above characteristics, polyimides are used and recommended within the scope of the present invention.

Figure 2:
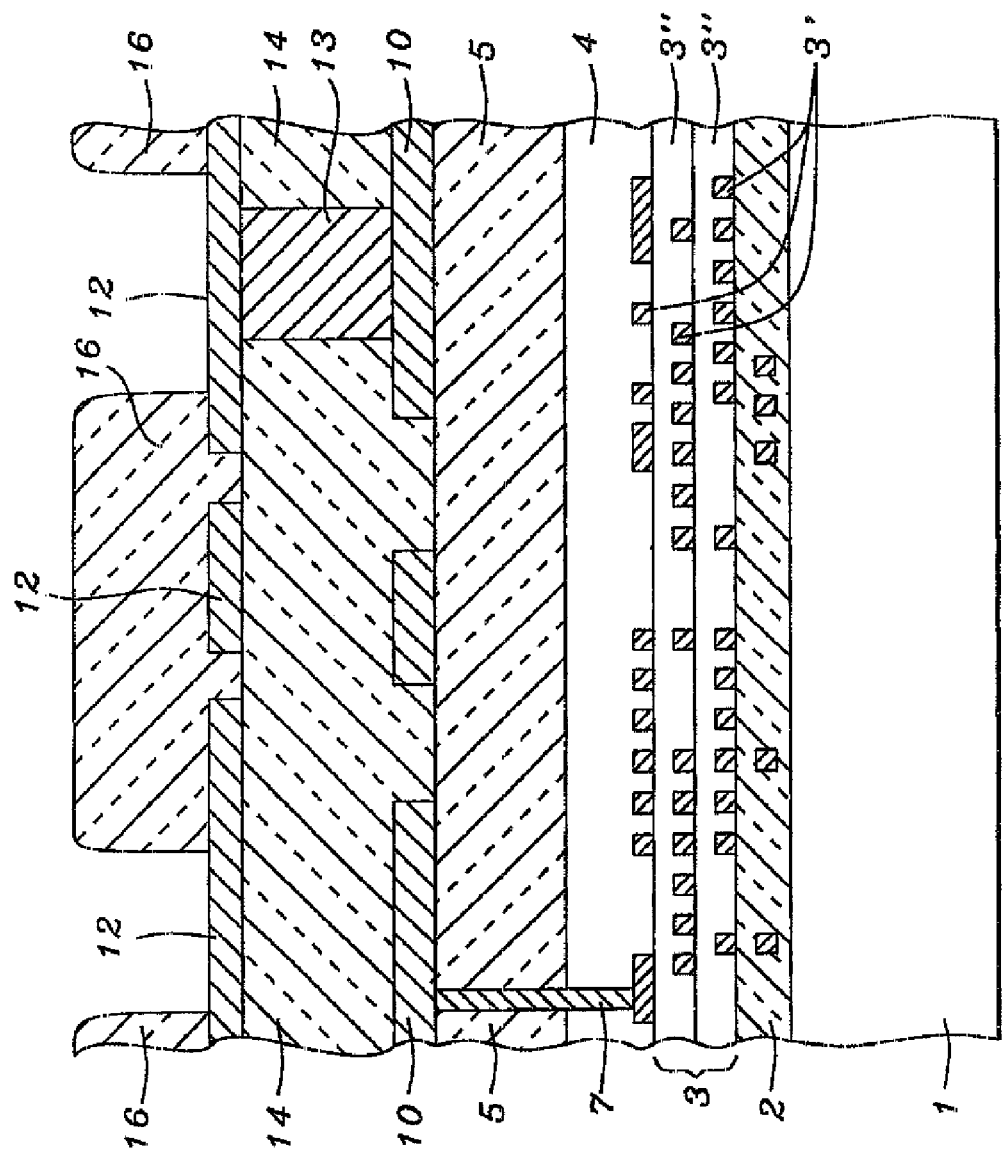
FIG. 2 shows a cross section of the present invention in a more complex circuit configuration.

FIG. 2 shows how the present invention as indicated in FIG. 1 can be further extended to include multiple layers of polyimide and, in so doing, can be adapted to a larger variety of applications. The lower level build up of this cross section is identical to the build up shown in FIG. 1 with a silicon wafer 1, the poly silicon layer 2, the metal and dielectric combined layer 3, the passivation layer 4, the polyimide layer 5 and the pads 10 deposited on top of layer 5. The function of the structure that has been described in FIG. 1 can be further extended by depositing another layer of polyimide 14 on top of the previously deposited layer 5 and overlaying the pads 10. Selective etching and metal deposition can further create contact points 12. These contact points 12 can be connected with pads 10 as shown by connector 13. Depositing pads 12 on top of layer 14 can thus further extend this process. These pads 12 can be further customized to a particular application, the indicated extension of multiple layers of polyimides greatly enhances the flexibility and usefulness of the present invention. Additional alternating layers of polyimide and metal lines and/or power or ground planes may be added above layers 12 and 16, as needed. Dielectric layers 14 and 16 can be formed as described above with reference to FIG. 1 for the dielectric layer 5.

Figure 3A:
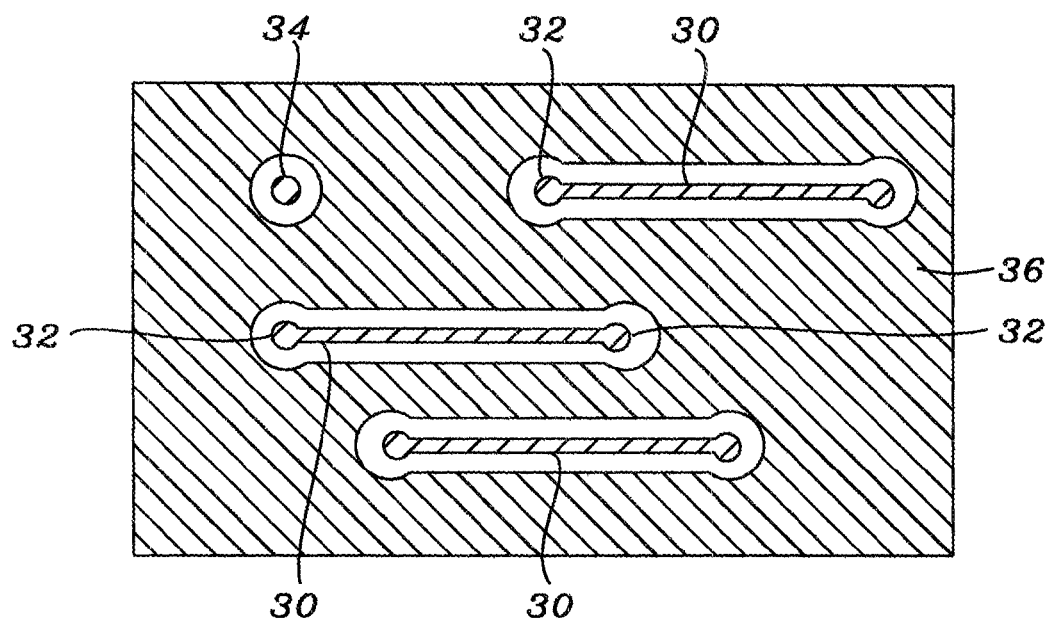
FIG. 3a shows the top view of a combination power and X-signal plane using the present invention.
Figure 3B:
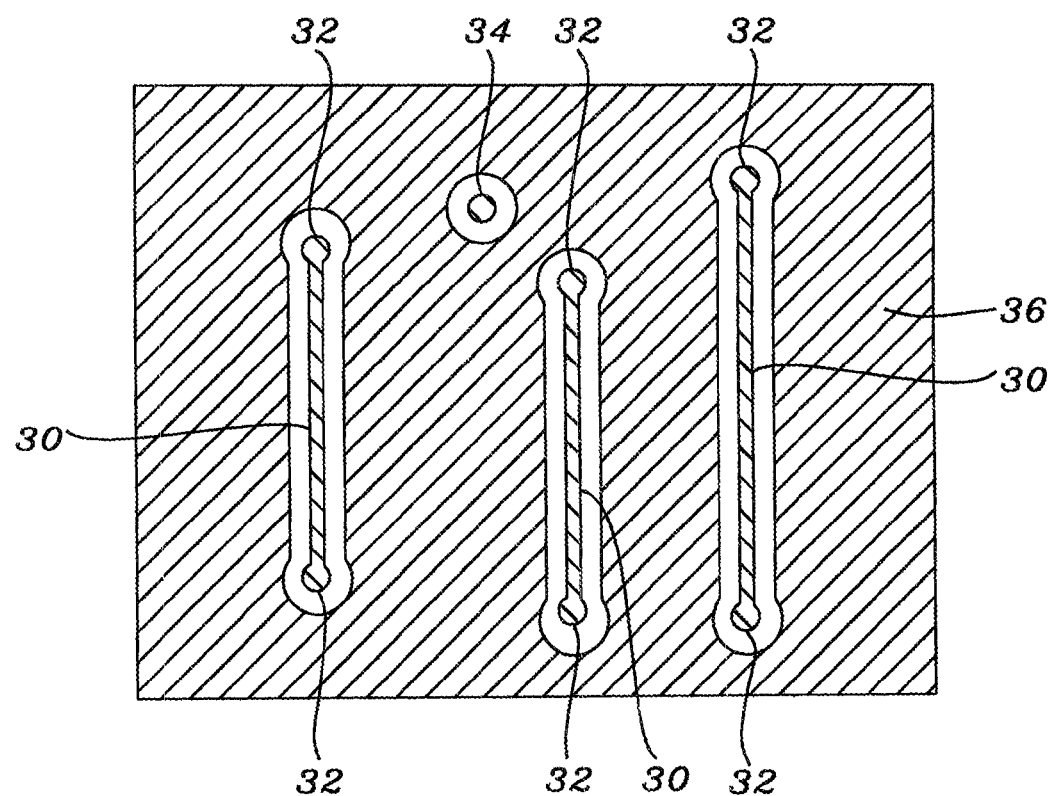
FIG. 3b shows the top view of a combination power and Y-signal plane using the present invention.

FIGS. 3a and 3b show a top view of one possible use of the present invention. Interconnecting a number of pads 32 that have been created as described creates signal lines 30. Additional contact points such as point 34 can allow signal lines to pass vertically between layers. The various contact points can, for instance, be created within the surface of a power plane or ground plane 36. The layers within the interconnecting metallization structure of the present invention can contain signal interconnections in the X-direction, signal interconnections in the Y-direction, signal interconnections between X and or Y directions, interconnections to and/or within power and/or ground buses. The present invention further teaches the interconnection of signal lines, power and ground buses between the connected IC's and the top of the metallization system of the present invention.

FIG. 3a shows signal lines formed in the X-direction. FIG. 3b shows signal lines formed in the Y-direction.

Figure 4:
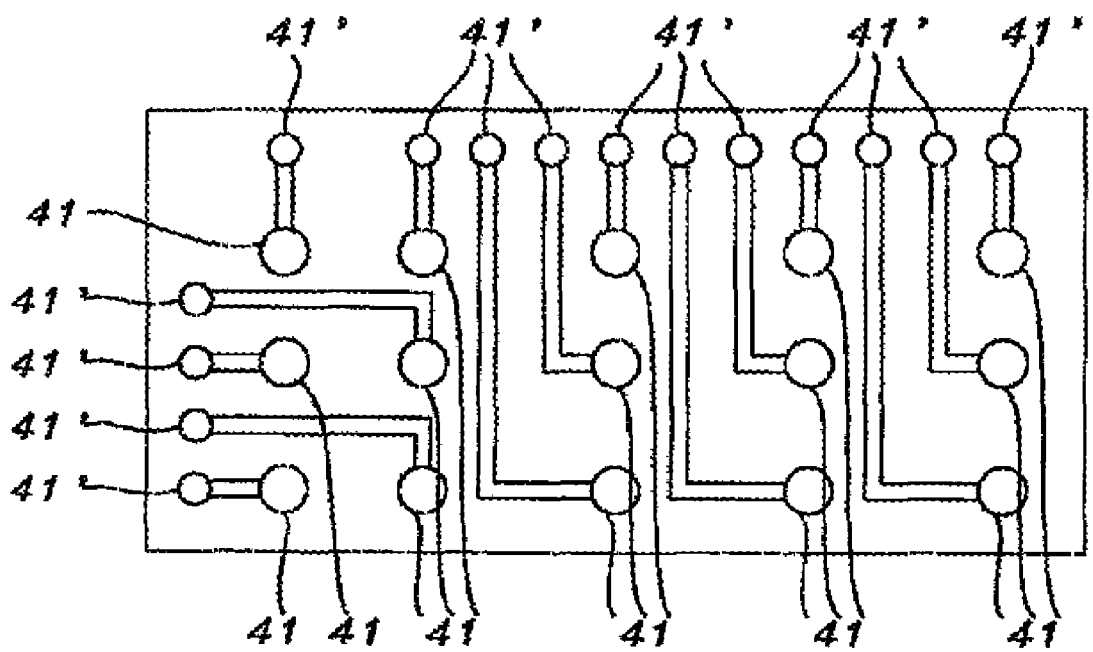
FIG. 4 shows the top view of solder bump arrangement using the present invention and is an expanded view of a portion of FIG. 5.

FIG. 4 presents yet another application of the present invention. Shown in FIG. 4 is an exploded view of a part of FIG. 5 that presents an area array I/O distribution. FIG. 4 shows pads 41 (on which solder bumps can be created) and an example of a layout of the redistribution of the peripheral pads 41'. The exploded view of FIG. 4 is taken along the line 2-2' shown in FIG. 5; the redistribution of the peripheral pads 41' (see FIG. 4) is, for clarity of overview, not shown in FIG. 5. The power or ground connections can be made to any point that is required on the bottom device. Furthermore, the power and ground planes can be connected to the power and ground planes of the package substrates. FIG. 4 shows an example of how to use the topmost metal layer to redistribute the peripheral pads 41' to become area array pads 41. The solder bumps can then be created on pads 41.

Figure 5:
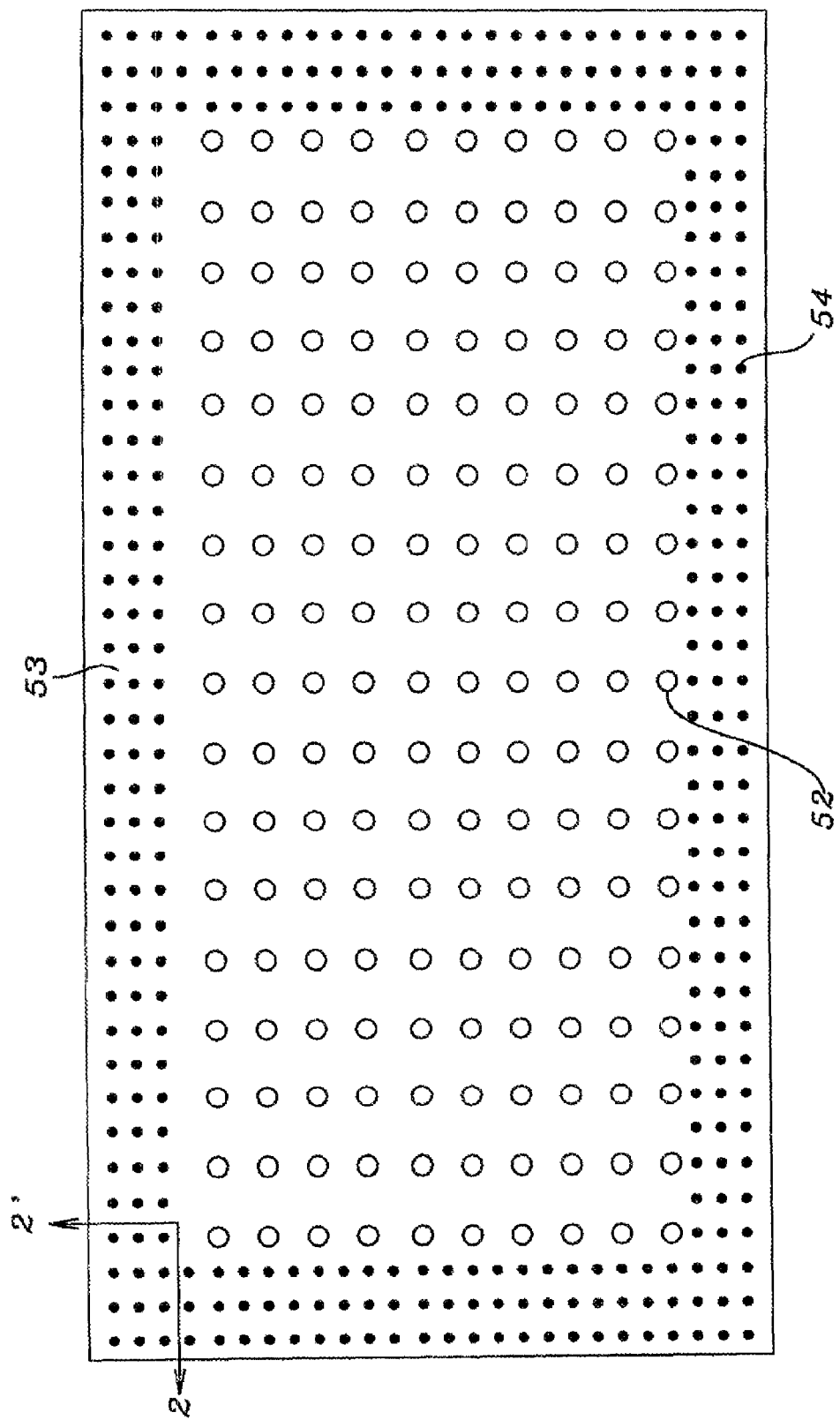
FIG. 5 shows the top view of an example of power/ground pads combined with signal pad using the present invention.

FIG. 5 shows the top surface of a plane that contains a design pattern of a combination of power or ground pads 52 and signal pads 54. FIG. 5 shows the pad openings in the top dielectric layer. It is to be noted that the ground/power pads 52 are heavier and larger in design relative to the signal pads 54. The present invention ideally lends itself to meeting these differences in design, as they are required within the art of chip and high performance circuit design. The number of power or ground pads 52 shown in FIG. 5 can be reduced if there are power and/or ground planes within the chip 53. From this it is clear that the package number of I/O's can be reduced within the scope of the present invention which leads to a reduction of the package cost by eliminating common signal/power/ground connections within the package. For instance, a 470 I/O count on a BGA chip can, within the scope of the present invention, be reduced to a 256 I/O count using the present invention. This results in considerable savings for the overall package.

Figure 6:
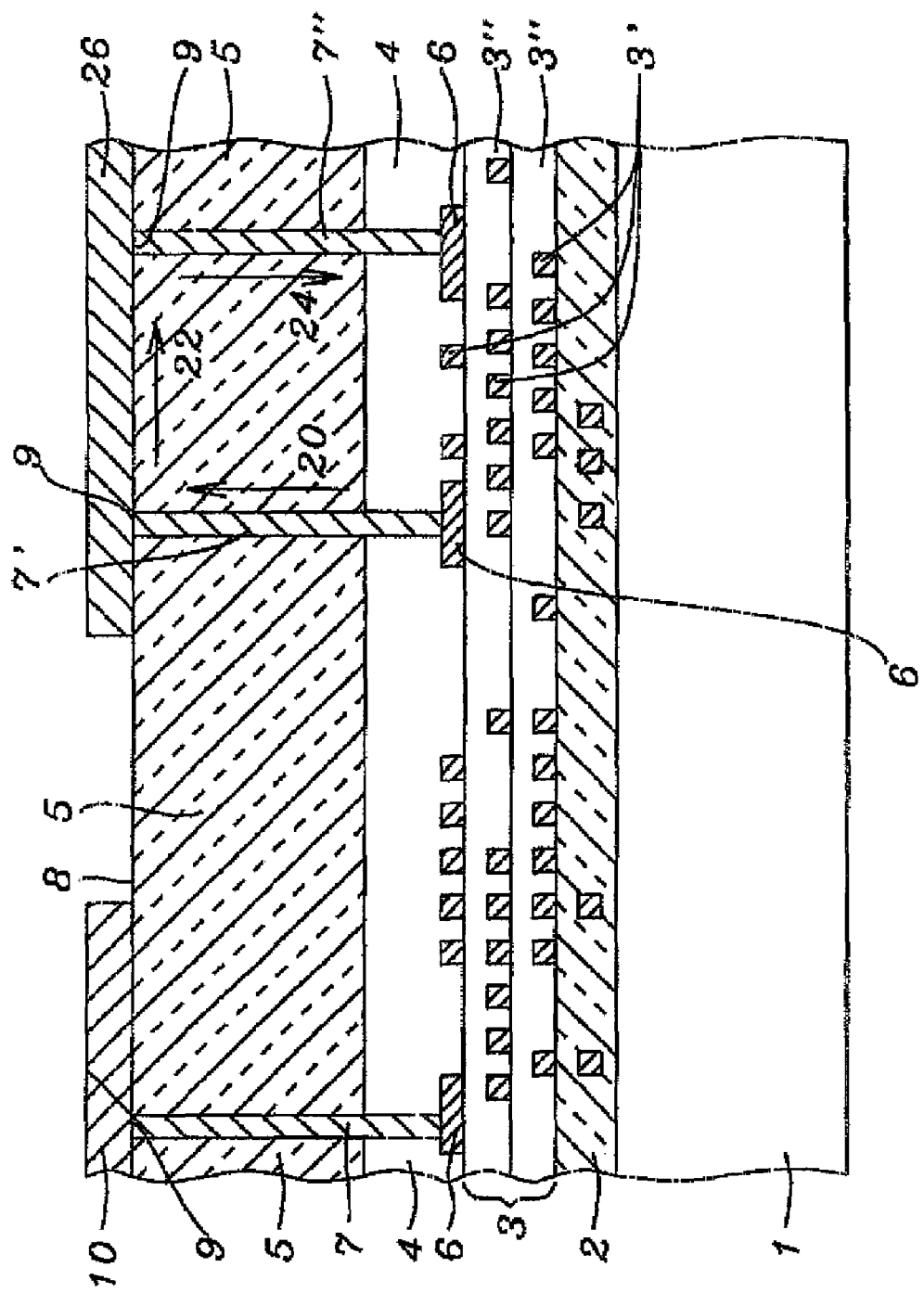
FIG. 6 shows a basic integrated circuit (IC) interconnect scheme of the invention.

FIG. 6 shows a basic design advantage of the invention. This advantage allows for the sub-micron or fine-lines, that run in the immediate vicinity of the metal layers 3' and the contact points 6, to be extended in an upward direction 20 through metal interconnect 7'. This extension continues in the direction 22 in the horizontal plane of the metal interconnect 26 and comes back down in the downward direction 24 through metal interconnect 7". The functions and constructs of the passivation layer 4 and the insulating layer 5 remain as previously highlighted under FIG. 1. This basic design advantage of the invention is to "elevate" or "fan-out" the fine-line interconnects and to remove these interconnects from the micron and sub-micron level to a metal interconnect level that has considerably larger dimensions and is therefore characterized by smaller resistance and capacitance and is easier and more cost effective to manufacture. This aspect of the invention does not include any aspect of conducting line re-distribution and therefore has an inherent quality of simplicity. It therefore further adds to the importance of the invention in that it makes micron and sub-micron wiring accessible at a wide-metal level. The interconnections 7' and 7" interconnect the fine-level metal by going up through the passivation and polymer or polyimide dielectric layers, traverses over a distance on the wide-metal level and continues by descending from the wide-metal level back down to the fine-metal level by again traversing down through the passivation and polymer or polyimide dielectric layers. The extensions that are in this manner accomplished need not to be limited to extending fine-metal interconnect points 6 of any particular type, such as signal or power or ground, with wide metal line 26. The laws of physics and electronics will impose limitations, if any, as to what type of interconnect can by established in this manner where limiting factors will be the conventional limiting factors of resistance, propagation delay, RC constants and others. The upper metallization structure over the passivation layer 4 may comprise any appropriate contact material, such as but not limited to tungsten, chromium, copper (electroplated or electroless), aluminum, polysilicon, or the like. The upper metallization structure over the passivation layer 4 and over the contact points 6 can be formed using a process comprising an electroplating process, a sputtering process, an electroless-plating process, or a damascene process. Where the invention is of importance is that the invention provides much broader latitude in being able to apply these laws and, in so doing, provides a considerably extended scope of the application and use of Integrated Circuits and the adaptation of these circuits to a wide-metal environment. The upper metallization structure may have multiple metal layers and multiple dielectric layers as depicted in FIG. 2. The upper metallization structure may comprise multiple metal traces and a metal plane, such as a power plane or ground plane, enclosing the metal traces as shown in FIGS. 3*a* and 3*b*.

Figure 7:
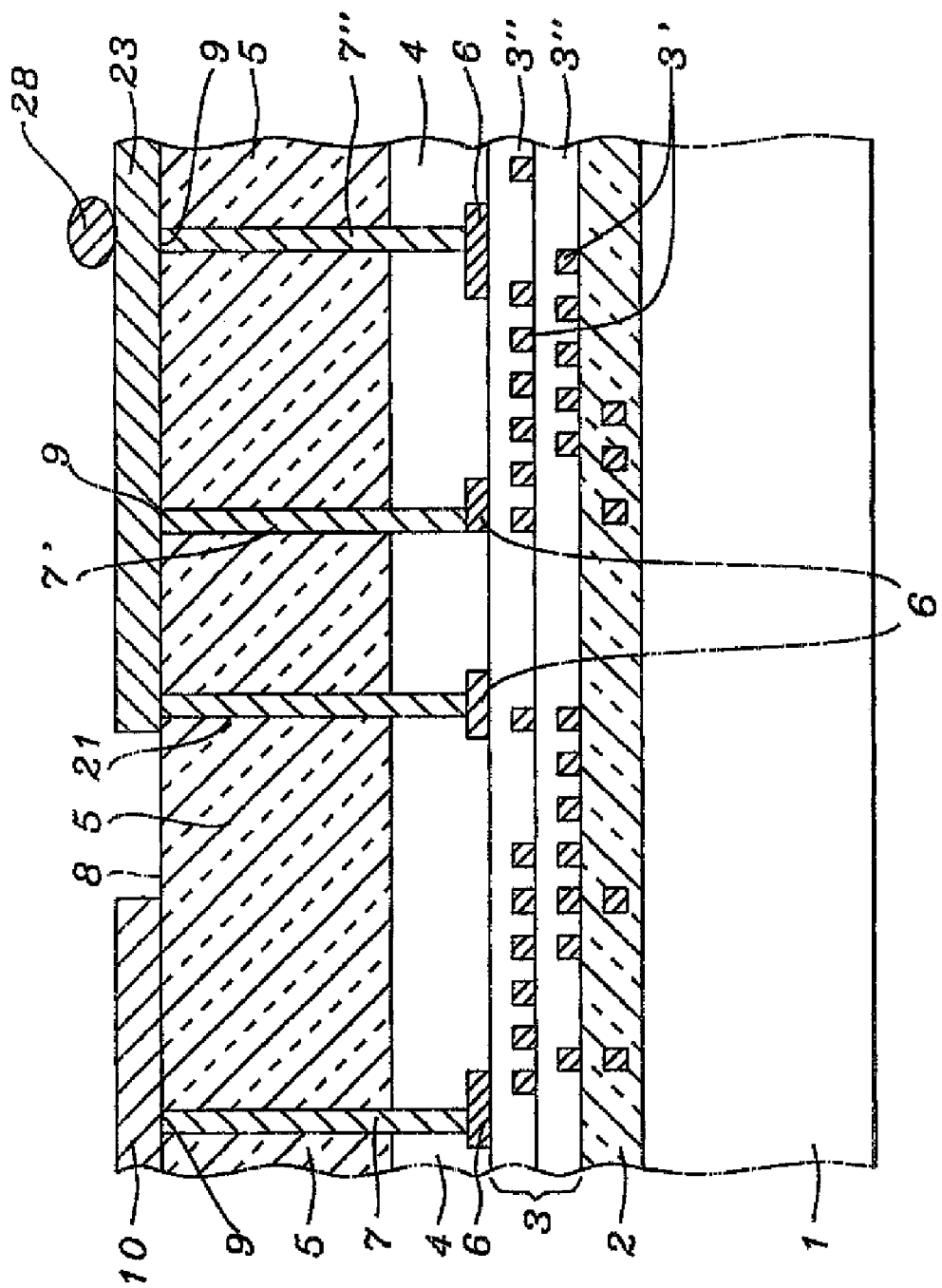
FIG. 7 shows an extension of the basic IC interconnect scheme by adding power, ground and signal distribution capabilities.

FIG. 7 shows how the basic interconnect aspect of the invention can further be extended to now not only elevate the fine-metal to the plane of the wide-metal but to also add power, ground and signal distribution interconnects of power, ground and signal planes at the wide-metal level. The wide-metal interconnect 26 of FIG. 6 is now extended to further include an interconnection with the via 21. In typical IC design, some pads may not be positioned in a location from which easy fan-out can be accomplished to a location that is required for the next step of circuit assembly. In those cases, the BGA substrate requires additional layers in the package construction in order to accomplish the required fan-out. The invention teaches an approach that makes additional layers in the assembling of an IC feasible while not unduly increasing the cost of creating such a multi-layer interface. Ball formation 28 on the surface of interconnect 23 indicates how the invention replaces part of the conventional BGA interconnect function, the solder bump provides for flip chip assembly. This interconnect 28 now connects the BGA device with surrounding circuitry at the wide-metal level as opposed to previous interconnects of the BGA device at the fine-metal level. The wide-metal interconnect of the BGA has obvious advantages of cost of manufacturing and improved BGA device performance. By being able to readily extend the wide-metal dimensions it also becomes possible to interconnect power, ground and signal lines at a wide-metal level thereby reducing the cost and complexity of performing this function at the fine-metal level. The indication of 28 as a ball does not imply that the invention is limited to solder bumps for making interconnects. The invention is equally applicable to wirebonding for making circuit interconnects.

Figure 8:
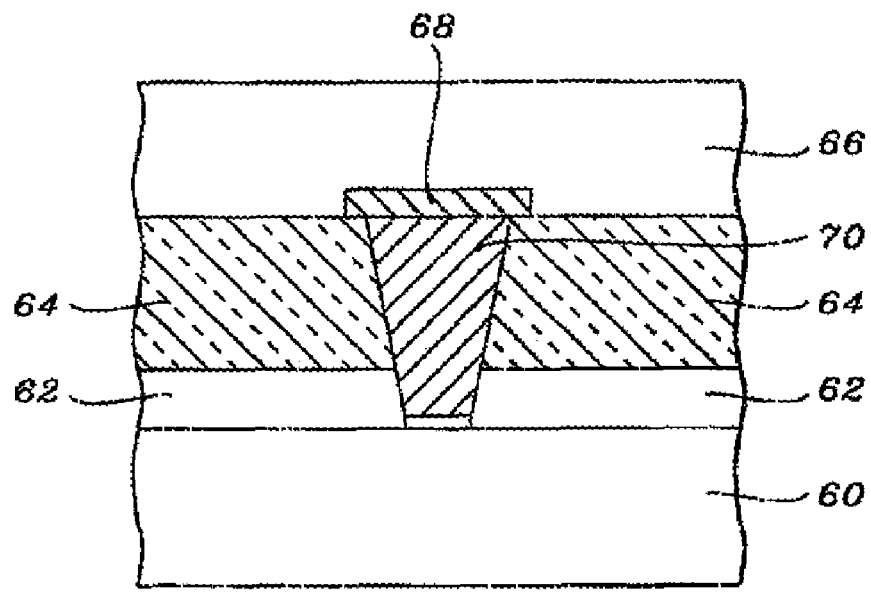
FIG. 8 shows an approach of how to transition from sub-micron micron metal to wide metal interconnects.

FIG. 8 further shows a cross section wherein the previous linear construction of the metal interconnection running through the passivation layer and the insulation layer is now conical in form. The sub-micron metal layer 60 is covered with a passivation layer 62, a layer 64 of polyimide or polymer is deposited over the passivation layer 62. The wide metal level 66 is formed on the surface of layer 64. The via 70 is shown as having sloping sides, these sloping sides can be achieved by controlling the photolithography process that is used to created the via 70. The etching of the polyimide or polymer can for instance be done under an angle of about 75 degrees with the following curing being done under an angle of 45 degrees. Also, a photosensitive polyimide or polymer can be used, the cone shape of the via 70 can in that case be achieved by variation of exposure combined with time of exposure combined with angle of exposure. Where non-photosensitive polymer or polyimide is used, a wet etch can be applied that has a gradated faster and longer time etch as the top of the via 70 is being approached. The layer of wide-metal pad 68 is deposited on the surface of the polymer or polyimide layer 64, the wide-metal pad deposition 68 mates with the top surface of the via 70 and is centered on top of this surface.

Figure 9:
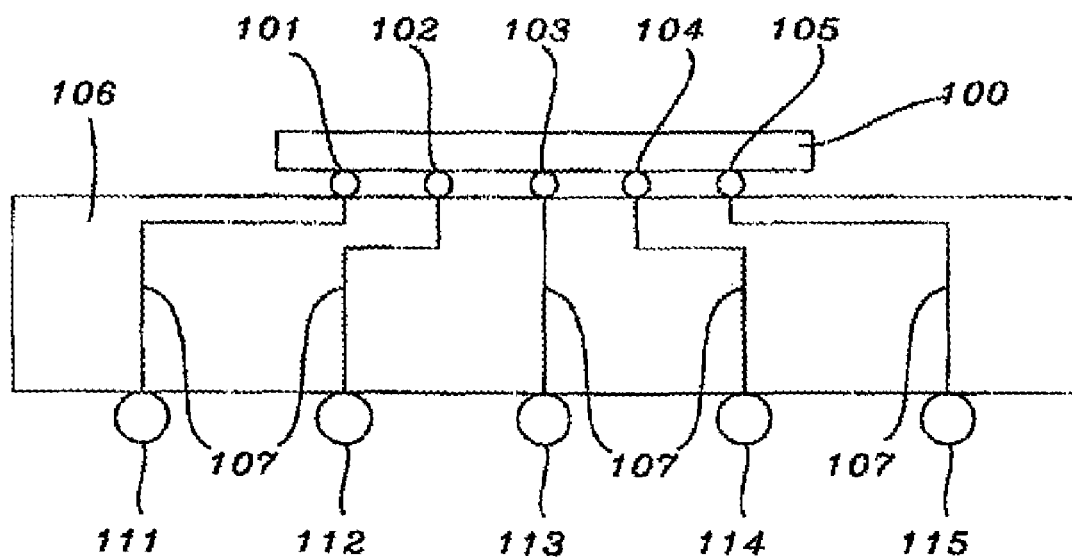
FIG. 9 shows detail regarding BGA device fan out using the invention.
Figure 10:
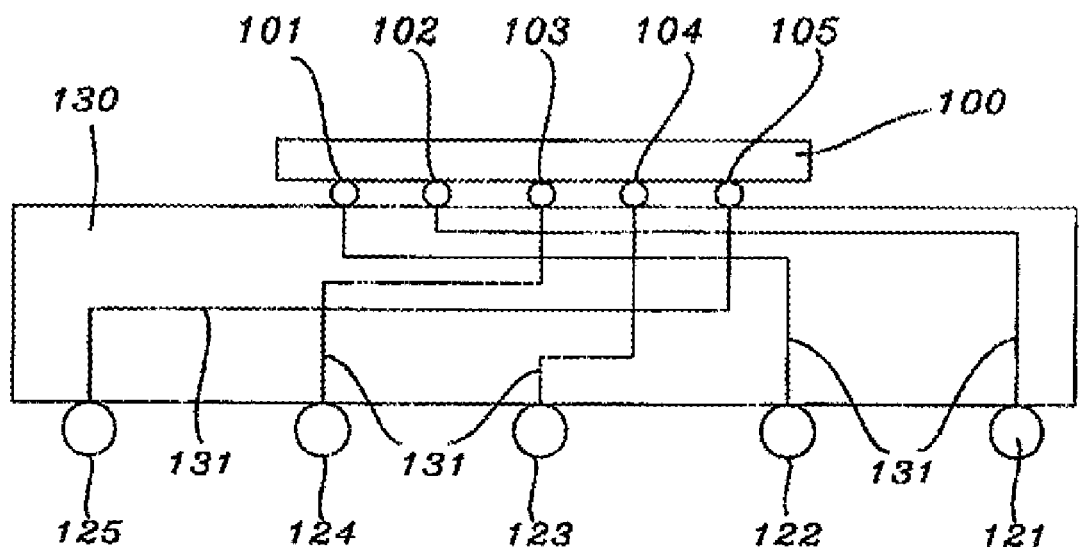
FIG. 10 shows detail regarding BGA device pad relocation using the invention.
Figure 11:
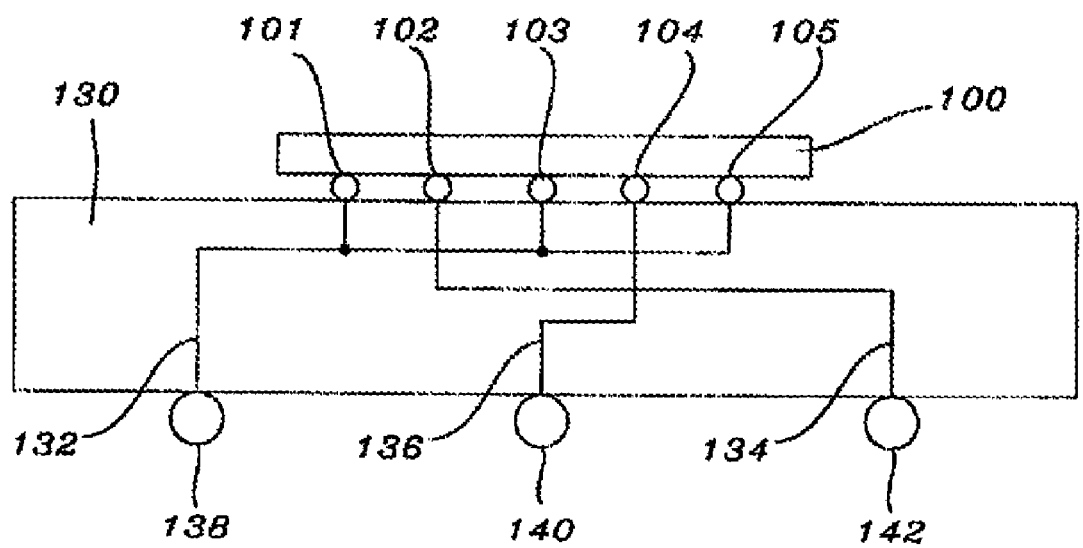
FIG. 11 shows detail regarding the usage of common power, ground and signal pads for BGA devices using the invention.

FIGS. 9 through 11 show further detail to demonstrate the concepts of BGA chip ball fan-out, pad relocation and the creation of common ground, power and signal pads. The concept of pad relocation, fan-out, pad addition or pad reduction can be realized by forming the wide and thick metal interconnection scheme over the passivation layer described in this invention, to replace the function of BGA substrate 130.

FIG. 9 shows a cross section 100 of a BGA chip, five balls 101 through 105 are also shown. By using the BGA substrate 106 and the wiring 107 within the substrate 106, it is clear that ball 101 can be repositioned to location 111, ball 102 to location 112, etc. for the remaining solder bumps 103 through 105. It is clear that the separation of contact points 111 through 115 is considerably larger than the separation of the original solder bumps 101 through 105. The BGA substrate 106 is the subject of the invention, this substrate allows for spreading the distance between the contact points or balls of the BGA device to a considerable degree.

FIG. 10 shows the concept of pad relocation. BGA pad 120 connects to any of the contact balls 101 through 105. By using the BGA substrate 130 and the wiring 131 that is provided within the substrate, it is clear that the BGA pads can be arranged in a different and arbitrary sequence that is required for further circuit design or packaging. For instance contact point 101, which is on the far left side of the BGA device 100, is re-routed to location 122 which is on the second far right of the BGA substrate 130. The re-arrangements of the other BGA solder bumps can readily be learned from following the wiring 131 within the substrate 131 and by tracing from solder bump to one of the contact points 122 through 125 of the BGA substrate.

FIG. 11 shows the interconnecting of BGA device solder bumps into common power, ground or signal pads. The BGA chip 100 is again shown with five solder bumps 101 through 105. The BGA substrate 130 contains a wiring scheme that contains in this example three wiring units, one for each for the power, ground and signal bumps of the BGA device. It is clear from FIG. 11 that wire arrangement 132 connects BGA device solder bumps 101, 103 and 105 to interconnect point 138 of the BGA substrate 130. It can further be seen that BGA device solder bump 104 is connected to interconnect point 140 of the BGA substrate by means of the wire arrangement 136, while BGA device solder bump 102 is connected to interconnect point 142 of the BGA substrate by means of the wire arrangement 134. The number of pins required to interconnect the BGA device 100 is in this manner reduced from five to three. It is clear that for more BGA device solder bumps, as is the case for an actual BGA device, the numeric effect of the indicated wiring arrangement is considerably more beneficial.

The concept of fan-out, pad relocation can be realized by forming the wide and thick metal interconnection scheme over the passivation layer described in this invention, to replace the function of BGA substrate 130. From FIGS. 9, 10 and 11 it can be seen that the extended functionality and extended wiring ability that are provided by the interconnect wiring schemes that are typically created in the BGA substrate 130 can be substituted by forming the wide and thick metal interconnection scheme over the passivation layer, on device 100. Some of the methods and possibilities of interconnect line routing that can be implemented using the method of the invention are highlighted in the following paragraphs.

Fan-out capability can be provided by the invention, using the metal conductors within the openings through the insulating layer and through the passivation layer that connect electrical contact pads of the top metallization structure with contact points of the interconnecting metallization structure. Each of the electrical contact points of the interconnecting metallization structure is connected directly and sequentially with at least one electrical contact point of the top metallization structure. In a fan-out scheme, the distance between electrical contact points of the top metallization structure is larger than the distance between electrical contact points of the interconnecting metallization structure by a measurable amount.

Alternatively, in a pad-addition scheme, the number of electrical contact pads of the upper metallization structure can exceed the number of contact points of the interconnecting metallization structure by a considerable amount. This provides an addition effect.

Pad relocation may also be accomplished by the method of the invention. Electrical contact points of the top metallization structure are connected with the contact points of the interconnecting metallization structure, directly but not necessarily sequentially, thereby creating a pad relocation effect. In this method, the distance between electrical contact points of the top metallization structure is larger than the distance between the electrical contact points of the interconnecting metallization structure by a measurable amount. The positions of the electrical contact points of the top metallization structure over the passivation layer from a top view are different from that of the contact points of the interconnecting metallization structure exposed by the openings in the passivation layer.

A reduction effect may also be accomplished by the method of the invention, wherein common nodes are connected together. Electrical contact points on a top surface of the top metallization structure are connected with contact points of the interconnecting metallization structure exposed by the openings in the passivation layer, where fewer contact points are used in the top metallization structure, since functionally equivalent contact points in the interconnecting metallization structure are connected together. That is, the number of contact points for a particular electrical function among the electrical contact points of the top metallization structure is smaller than the number of electrical contact points of the interconnecting metallization structure exposed by the passivation layer by a measurable amount.

Some of the advantages of the present invention are:

1) improved speed of the IC interconnections due to the use of wider metal lines (which results in lower resistance) and thicker dielectrics between the interconnecting lines (which results in lower capacitance and reduced RC delay). The improved speed of the IC interconnections results in improved performance of High Performance IC's.

2) an inexpensive manufacturing process since there is no need for expensive equipment that is typically used in sub-micron IC fabrication; there is also no need for the extreme clean room facilities that are typically required for sub-micron manufacturing.

3) reduced packaging costs due to the elimination of the need for redundant I/O and multiple power and ground connection points that are needed in a typical IC packaging.

4) IC's of reduced size can be packaged and interconnected with other circuit or system components without limiting the performance of the IC's.

5) since dependence on ultra-fine wiring is reduced, the use of low resistance conductor wires is facilitated.

6) structures containing more complicated IC's can be created because the invention allows for increased I/O pin count.

7) more complicated IC's can be created without the need for a significant increase in re-distribution of package I/O connections.

8) power buses and clock distribution networks are easier to integrate within the design of IC's.

9) future system-on-chip designs will benefit from the present invention since it allows ready and cost effective interconnection between functional circuits that are positioned at relatively large distances from each other on the chip.

10) form the basis for a computer based routing tool that automatically routes interconnections that exceed a pre-determined length in accordance with the type of interconnection that needs to be established.

11) provide a means to standardize BGA packaging.

12) be applicable to both solder bumps and wirebonding for making further circuit interconnects.

13) provide a means for BGA device solder bump fan-out thereby facilitating the packing and design of BGA devices.

14) provide a means for BGA device pad relocation thereby providing increased flexibility for the packing and design of BGA devices.

15) provide a means for common BGA device power, ground and signal lines thereby reducing the number of pins required to interconnect the BGA device with the surrounding circuits.

16) provide a means for more relaxed design rules in designing circuit vias by the application of sloped vias.

17) provide the means for extending a fine-wire interconnect scheme to a wide-wire interconnect scheme without the need to apply a passivation layer over the surface of the fine-wire structure.

Although the preferred embodiment of the present invention has been illustrated, and that form has been described in detail, it will be readily understood by those skilled in the art that various modifications may be made therein without departing from the spirit of the invention or from the scope of the appended claims.

What is claimed is:

1. An integrated circuit chip comprising:
   a silicon substrate;
   multiple devices in and on said silicon substrate, wherein said multiple devices comprise a transistor;
   a first dielectric layer over said silicon substrate;
   a first metallization structure over said first dielectric layer, wherein said first metallization structure comprises a first metal layer and a second metal layer over said first metal layer;
   a second dielectric layer between said first and second metal layers;

a passivation layer over said first metallization structure and said first and second dielectric layers, wherein a first opening in said passivation layer is over a first contact point of a first metal interconnect of said first metallization structure, and said first contact point is at a bottom of said first opening, and wherein a second opening in said passivation layer is over a second contact point of a second metal interconnect of said first metallization structure, and said second contact point is at a bottom of said second opening, wherein said first metal interconnect has a portion spaced apart from said second metal interconnect, wherein said passivation layer comprises a nitride layer;

a polymer layer on said passivation layer, wherein a third opening in said polymer layer is over said first contact point, wherein a fourth opening in said polymer layer is over said second contact point, wherein said polymer layer has a thickness between 2 and 30 micrometers; and a second metallization structure over said polymer layer and said first and second contact points, wherein said first contact point is connected to said second contact point though said second metallization structure, wherein said second metallization structure is configured to be wirebonded.

2. The integrated circuit chip of claim 1, wherein said second metallization structure comprises electroplated copper.

3. The integrated circuit chip of claim 1, wherein said second metallization structure comprises aluminum.

4. The integrated circuit chip of claim 1, wherein said second metallization structure comprises nickel.

5. The integrated circuit chip of claim 1, wherein said passivation layer further comprises an oxide layer under said nitride layer.

6. The integrated circuit chip of claim 1, wherein said second metallization structure comprises an electroplated metal.

7. The integrated circuit chip of claim 1, wherein said polymer layer comprises polyimide.

8. The integrated circuit chip of claim 1, wherein said polymer layer comprises benzocyclobutene (BCB).

9. The integrated circuit chip of claim 1, wherein said first metallization structure comprises electroplated copper.

10. The integrated circuit chip of claim 1, wherein said first metallization structure comprises aluminum.

11. The integrated circuit chip of claim 1, wherein said second metal interconnect has a portion spaced apart from said portion of said first metal interconnect, wherein said portion of said first metal interconnect comprises said first contact point, and wherein said portion of said second metal interconnect comprises said second contact point.

12. An integrated circuit chip comprising:
a silicon substrate;
multiple devices in and on said silicon substrate, wherein said multiple devices comprise a transistor;
a first dielectric layer over said silicon substrate;
a metallization structure over said first dielectric layer, wherein said metallization structure comprises a first metal layer and a second metal layer over said first metal layer;
a second dielectric layer between said first and second metal layers;
a passivation layer over said metallization structure and said first and second dielectric layers, wherein a first opening in said passivation layer is over a first contact point of a first metal interconnect of said metallization structure, and said first contact point is at a bottom of said first opening, and wherein a second opening in said passivation layer is over a second contact point of a second metal interconnect of said metallization structure, and said second contact point is at a bottom of said second opening, wherein said first metal interconnect has a portion spaced apart from said second metal interconnect, wherein said passivation layer comprises a nitride layer; and a signal interconnect over said passivation layer and on said first and second contact points, wherein said first contact point is connected to said second contact point through said signal interconnect, wherein said signal interconnect comprises electroplated copper.

13. The integrated circuit chip of claim 12, wherein said passivation layer further comprises an oxide layer under said nitride layer.

14. The integrated circuit chip of claim 12, wherein said signal interconnect further comprises a sputtered metal under said electroplated copper.

15. The integrated circuit chip of claim 12, wherein said signal interconnect further comprises nickel.

16. The integrated circuit chip of claim 12, wherein said metallization structure comprises electroplated copper.

17. The integrated circuit chip of claim 12, wherein said metallization structure comprises aluminum.

18. The integrated circuit chip of claim 12, wherein said nitride layer has a thickness between 0.5 and 2 micrometers.

19. The integrated circuit chip of claim 12, wherein said second metal interconnect has a portion spaced apart from said portion of said first metal interconnect, wherein said portion of said first metal interconnect comprises said first contact point, and wherein said portion of said second metal interconnect comprises said second contact point.

20. An integrated circuit chip comprising:
a silicon substrate;
multiple devices in and on said silicon substrate, wherein said multiple devices comprise a transistor;
a first dielectric layer over said silicon substrate;
a metallization structure over said first dielectric layer, wherein said metallization structure comprises a first metal layer and a second metal layer over said first metal layer;
a second dielectric layer between said first and second metal layers;
a passivation layer over said metallization structure and said first and second dielectric layers, wherein a first opening in said passivation layer is over a first contact point of a first metal interconnect of said metallization structure, and said first contact point is at a bottom of said first opening, and wherein a second opening in said passivation layer is over a second contact point of a second metal interconnect of said metallization structure, and said second contact point is at a bottom of said second opening, wherein said first metal interconnect has a portion spaced apart from said second metal interconnect, wherein said passivation layer comprises a nitride layer;
a polymer layer on said passivation layer, wherein a third opening in said polymer layer is over said first contact point, and wherein a fourth opening in said polymer layer is over said second contact point, wherein said polymer layer has a thickness between 2 and 30 micrometers; and
a signal interconnect on said polymer layer and over said first and second contact points, wherein said first contact point is connected to said second contact point though said signal interconnect.

21. The integrated circuit chip of claim 20, wherein said signal interconnect comprises electroplated copper.

22. The integrated circuit chip of claim 20, wherein said signal interconnect comprises aluminum.

23. The integrated circuit chip of claim 20, wherein said signal interconnect comprises nickel.

24. The integrated circuit chip of claim 20, wherein said passivation layer further comprises an oxide layer under said nitride layer.

25. The integrated circuit chip of claim 20, wherein said nitride layer has a thickness between 0.5 and 2 micrometers.

26. The integrated circuit chip of claim 20, wherein said polymer layer comprises polyimide.

27. The integrated circuit chip of claim 20, wherein said polymer layer comprises beuzocyclobutene (BCB).

28. The integrated circuit chip of claim 20, wherein said metallization structure comprises electroplated copper.

29. The integrated circuit chip of claim 20, wherein said metallization structure comprises aluminum.

30. The integrated circuit chip of claim 20, wherein said second metal interconnect has a portion spaced apart from said portion of said first metal interconnect, wherein said portion of said first metal interconnect comprises said first contact point, and wherein said portion of said second metal interconnect comprises said second contact point.

31. An integrated circuit chip comprising:
a silicon substrate;
multiple devices in and over said silicon substrate, wherein said multiple devices comprise a transistor;
a first dielectric layer over said silicon substrate;
a first metallization structure over said first dielectric layer, wherein said first metallization structure comprises a first metal layer and a second metal layer over said first metal layer, wherein said first metallization structure comprises electroplated copper;
a second dielectric layer between said first and second metal layers;
a separating layer over said first and second dielectric layers and said first metallization structure, wherein a first opening in said separating layer is over a contact point of said first metallization structure, and said contact point is at a bottom of said first opening;
a second metallization structure over said separating layer and on said contact point, wherein said second metallization structure comprises a third metal layer and a fourth metal layer over said third metal layer and vertically over said contact point, wherein said third metal layer is connected to said contact point through said first opening, wherein said second metallization structure comprises aluminum over said separating layer;
a first polymer layer between said third and fourth metal layers, wherein said third metal layer is connected to said fourth metal layer through a second opening in said first polymer layer; and
a second polymer layer over said fourth metal layer.

32. The integrated circuit chip of claim 31, wherein said separating layer comprises a nitride layer.

33. The integrated circuit chip of claim 31, wherein said first opening has a width between 0.5 and 3 micrometers.

34. The integrated circuit chip of claim 31, wherein said second metallization structure further comprises nickel.

35. The integrated circuit chip of claim 31 further comprising a third polymer layer on said separating layer, wherein said third metal layer is on said third polymer layer.

36. An integrated circuit chip comprising:
a silicon substrate;
multiple devices in and over said silicon substrate, wherein said multiple devices comprise a transistor;
a first dielectric layer over said silicon substrate;
a first metallization structure over said first dielectric layer, wherein said first metallization structure comprises a first metal layer and a second metal layer over said first metal layer, wherein said first metallization structure comprises electroplated copper;
a second dielectric layer between said first and second metal layers;
a separating layer over said first and second dielectric layers and said first metallization structure, wherein a first opening in said separating layer is over a contact point of said first metallization structure, and said contact point is at a bottom of said first opening, wherein said separating layer comprises a nitride layer with a thickness between 0.5 and 2 micrometers, wherein said first opening has a width between 0.5 and 3 micrometers;
a second metallization structure over said separating layer and on said contact point, wherein said second metallization structure comprises a third metal layer and a fourth metal layer over said third metal layer and vertically over said contact point, wherein said third metal layer is connected to said contact point through said first opening, wherein said second metallization structure comprises electroplated copper over said separating layer; and
a first polymer layer between said third and fourth metal layers, wherein said third metal layer is connected to said fourth metal layer through a second opening in said first polymer layer.

37. The integrated circuit chip of claim 36, wherein said second metallization structure further comprises nickel.

38. The integrated circuit chip of claim 36 further comprising a second polymer layer over said fourth metal layer.

39. An integrated circuit chip comprising:
a silicon substrate;
multiple devices in and on said silicon substrate, wherein said multiple devices comprise a transistor;
a first dielectric layer over said silicon substrate;
a first metallization structure over said first dielectric layer, wherein said first metallization structure comprises a first metal layer and a second metal layer over said first metal layer;
a second dielectric layer between said first and second metal layers;
a passivation layer over said first metallization structure and said first and second dielectric layers, wherein a first opening in said passivation layer is over a first contact point of a first metal interconnect of said first metallization structure, and said first contact point is at a bottom of said first opening, and wherein a second opening in said passivation layer is over a second contact point of a second metal interconnect of said first metallization structure, and said second contact point is at a bottom of said second opening, wherein said first metal interconnect has a portion spaced apart from said second metal interconnect, wherein said passivation layer comprises a nitride layer;
a polymer layer on said passivation layer, wherein a third opening in said polymer layer is over said first contact point, and wherein a fourth opening in said polymer layer is over said second contact point, wherein said polymer layer has a thickness between 2 and 30 micrometers;
a second metallization structure on said polymer layer and said first and second contact points, wherein said first contact point is connected to said second contact point through said second metallization structure, wherein said second metallization structure comprises aluminum; and an interconnect bump on said second metallization structure.

40. The integrated circuit chip of claim 39, wherein said passivation layer further comprises an oxide layer under said nitride layer.

41. The integrated circuit chip of claim 39, wherein said first metallization structure comprises electroplated copper.

42. The integrated circuit chip of claim 39, wherein said first metallization structure comprises aluminum.

43. The integrated circuit chip of claim 39, wherein said second metal interconnect has a portion spaced apart from said portion of said first metal interconnect, wherein said portion of said first metal interconnect comprises said first contact point, and wherein said portion of said second metal interconnect comprises said second contact point.

44. An integrated circuit chip comprising:
a silicon substrate;
multiple devices in and on said silicon substrate, wherein said multiple devices comprise a transistor;
a first dielectric layer over said silicon substrate;
a metallization structure over said first dielectric layer, wherein said metallization structure comprises a first metal layer and a second metal layer over said first metal layer, wherein said metallization structure comprises electroplated copper;
a second dielectric layer between said first and second metal layers;
a separating layer over said metallization structure and said first and second dielectric layers, wherein multiple openings in said separating layer are over multiple first contact points of said metallization structure, and said multiple first contact points are at bottoms of said multiple openings, wherein said multiple first contact points have a particular common electrical function, wherein said separating layer comprises a nitride layer; and
a metal interconnect over said separating layer and on said multiple first contact points, wherein said multiple first contact points are connected to each other through said metal interconnect, wherein said metal interconnect comprises multiple second contact points having said particular common electrical function, wherein said metal interconnect comprises aluminum.

45. The integrated circuit chip of claim 44 further comprising a solder bump on said metal interconnect.

46. The integrated circuit chip of claim 44, wherein said nitride layer has a thickness between 0.5 and 2 micrometers.

47. The integrated circuit chip of claim 44 further comprising a metal bump on said metal interconnect.

48. The integrated circuit chip of claim 44, wherein one of said multiple openings has a width between 0.5 and 3 micrometers.

49. The integrated circuit chip of claim 44 further comprising a polymer layer on said separating layer, wherein said metal interconnect is further on said polymer layer.

50. The integrated circuit chip of claim 44, wherein said particular common electrical function comprises a ground function.

51. The integrated circuit chip of claim 44, wherein said particular common electrical function comprises a signal function.

52. The integrated circuit chip of claim 44, wherein said particular common electrical function comprises a power function.

53. The integrated circuit chip of claim 44, wherein a total number of said multiple second contact points is smaller than that of said multiple first contact points.

54. The integrated circuit chip of claim 44, wherein said metal interconnect is configured for wirebonding.

55. The integrated circuit chip of claim 44 further comprising multiple metal bumps on said multiple second contact points.

56. The integrated circuit chip of claim 44, wherein said separating layer further comprises an oxide layer under said nitride layer.

* * * * *